US009443695B2

United States Patent
Ohashi et al.

(10) Patent No.: US 9,443,695 B2
(45) Date of Patent: Sep. 13, 2016

(54) CHARGED-PARTICLE BEAM DEVICE

(71) Applicant: HITACHI HIGH-TECHNOLOGIES CORPORATION, Minato-ku, Tokyo (JP)

(72) Inventors: Takeyoshi Ohashi, Tokyo (JP); Yasunari Sohda, Tokyo (JP); Noritsugu Takahashi, Tokyo (JP); Hajime Kawano, Tokyo (JP); Osamu Komuro, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/759,782

(22) PCT Filed: Dec. 11, 2013

(86) PCT No.: PCT/JP2013/083191
§ 371 (c)(1),
(2) Date: Jul. 8, 2015

(87) PCT Pub. No.: WO2014/109163
PCT Pub. Date: Jul. 17, 2014

(65) Prior Publication Data
US 2015/0348747 A1    Dec. 3, 2015

(30) Foreign Application Priority Data

Jan. 11, 2013 (JP) ................ 2013-003054

(51) Int. Cl.
*H01J 37/28* (2006.01)
*H01J 37/21* (2006.01)
(Continued)

(52) U.S. Cl.
CPC .......... *H01J 37/222* (2013.01); *H01J 37/1475* (2013.01); *H01J 37/20* (2013.01);
(Continued)

(58) Field of Classification Search
CPC ........ H01J 37/28; H01J 37/222; H01J 37/05; H01J 37/1472; H01J 37/1475; H01J 37/3005; H01J 37/3023; H01J 37/304; H01J 37/3177; G01N 23/225; G01N 23/2251; G01N 21/8851; G01N 21/95607
USPC .............. 250/310, 307, 306, 396 ML, 492.2, 250/208.1, 305, 309, 311, 397, 442.11, 250/492.22, 492.3, 548, 559.3
See application file for complete search history.

(56) References Cited

U.S. PATENT DOCUMENTS 5,369,450 A * 11/1994 Haseltine ................. H04N 9/28
                                                            315/368.12
5,528,048 A *  6/1996 Oae ........................ B82Y 10/00
                                                            250/492.2
(Continued)

FOREIGN PATENT DOCUMENTS

JP      3-173053 A      7/1991
JP      9-167587 A      6/1997
(Continued)

*Primary Examiner* — David A Vanore
(74) *Attorney, Agent, or Firm* — Miles & Stockbridge P.C.

(57) ABSTRACT

This charged-particle beam device changes conditions for combining an intensity ratio between upper and lower deflectors and rotation angles of the deflectors in multiple ways when obtaining images having different pixel sizes in the vertical and horizontal directions. Then, the charged-particle beam device determines an optimal intensity ratio between the upper and lower deflectors and rotation angles of the deflectors on the basis of variations in size value measured in the larger pixel size direction (Y-direction) of the image. As a result, it is possible to extend the field of view in the Y-direction while reducing deflection aberrations when measuring at high precision in the X-direction.

11 Claims, 19 Drawing Sheets

(51) Int. Cl.
*H01J 37/22* (2006.01)
*H01J 37/20* (2006.01)
*H01J 37/147* (2006.01)

(52) U.S. Cl.
CPC ........... *H01J 37/28* (2013.01); *H01J 37/1472* (2013.01); *H01J 2237/1536* (2013.01); *H01J 2237/221* (2013.01); *H01J 2237/2448* (2013.01); *H01J 2237/2806* (2013.01); *H01J 2237/2809* (2013.01); *H01J 2237/2817* (2013.01)

(56) References Cited

U.S. PATENT DOCUMENTS

| | | | | |
|---|---|---|---|---|
| 6,107,637 A | * | 8/2000 | Watanabe | B82Y 10/00 250/208.1 |
| 6,155,726 A | * | 12/2000 | Ishikawa | B41J 2/473 355/27 |
| 6,252,412 B1 | * | 6/2001 | Talbot | G06T 7/0004 324/754.22 |
| 6,587,581 B1 | * | 7/2003 | Tanaka | G01N 21/8851 250/305 |
| 7,420,164 B2 | * | 9/2008 | Nakasuji | H01J 37/141 250/307 |
| 7,659,508 B2 | * | 2/2010 | Nasu | G01B 15/00 250/307 |
| 2002/0056808 A1 | * | 5/2002 | Tsuneta | H01J 37/21 250/306 |
| 2004/0051040 A1 | * | 3/2004 | Nasu | G01B 15/00 250/310 |
| 2005/0263715 A1 | * | 12/2005 | Nakasuji | H01J 37/141 250/396 ML |
| 2006/0151698 A1 | * | 7/2006 | Sasaki | H01J 37/153 250/310 |
| 2008/0315090 A1 | * | 12/2008 | Nakasuji | H01J 37/141 250/306 |
| 2009/0212213 A1 | * | 8/2009 | Nakasuji | G01N 23/2251 250/310 |
| 2012/0104253 A1 | * | 5/2012 | Tsuneta | H01J 37/20 250/307 |
| 2013/0068949 A1 | * | 3/2013 | Urano | H01J 37/153 250/310 |
| 2013/0301805 A1 | * | 11/2013 | Hemberg | H01J 35/08 378/137 |
| 2015/0348747 A1 | * | 12/2015 | Ohashi | H01J 37/1475 250/310 |

FOREIGN PATENT DOCUMENTS

| | | |
|---|---|---|
| JP | 2006-173035 A | 6/2006 |
| WO | WO 03-021186 A1 | 3/2003 |

* cited by examiner

| INTENSITY RATIO | ROTATION ANGLE | EVALUATION VALUE |
|---|---|---|
| 0.95 | 178° | 2.6 |
| 0.95 | 180° | 1.9 |
| 0.95 | 182° | 2.1 |
| 1.00 | 178° | 2.0 |
| 1.00 | 180° | 0.8 |
| 1.00 | 182° | 0.9 |
| ⋮ | ⋮ | ⋮ |

F I G . 1 2
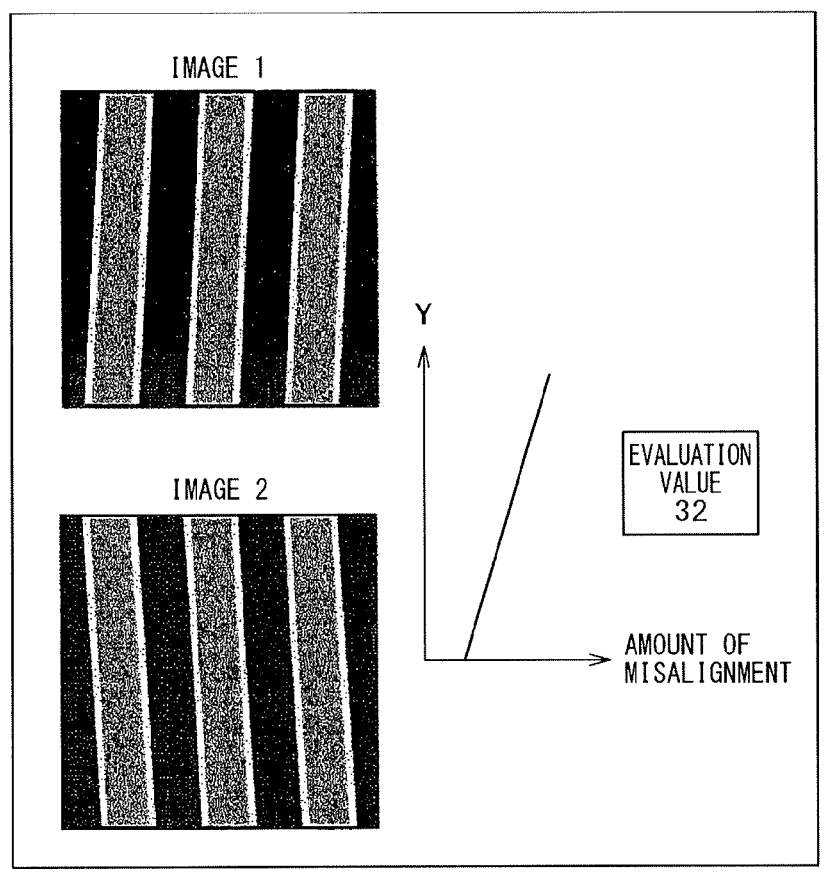

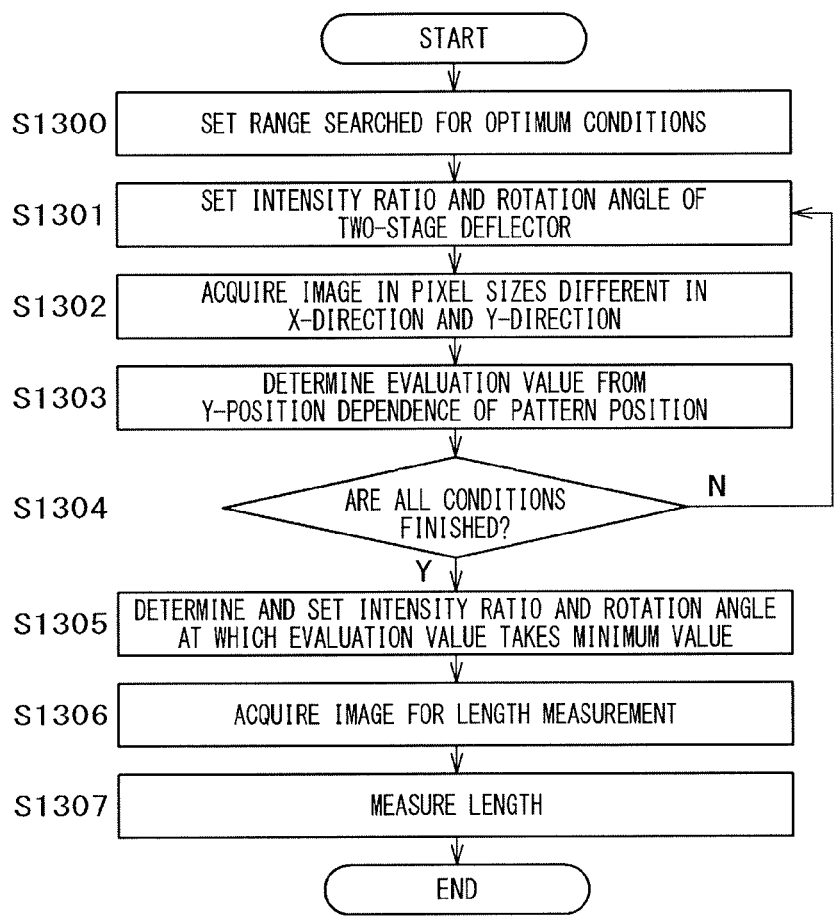

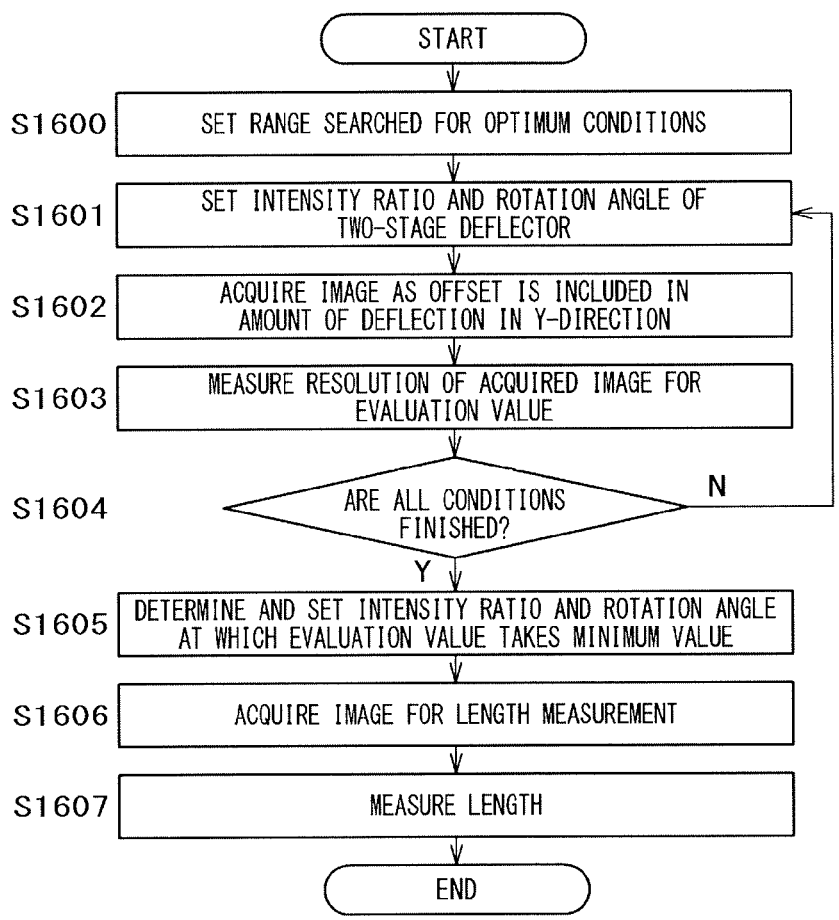

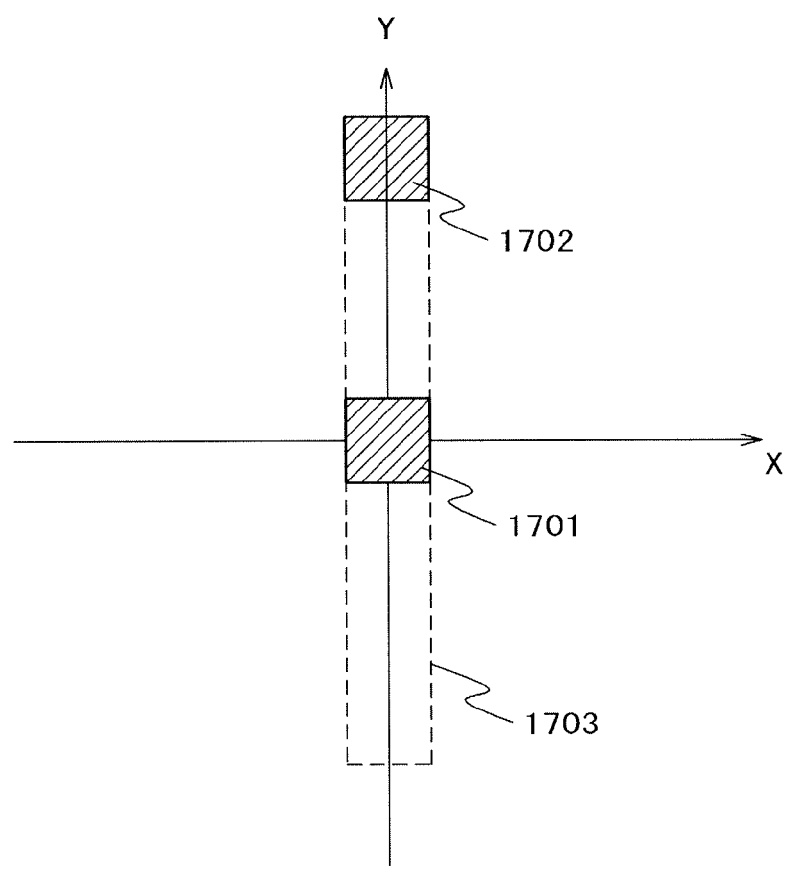
F I G . 1 7

FIG. 20A

| DEFLECTION ABERRATION EVALUATION RESULT |
|---|
| EVALUATION VALUE: 0.2<br><br>IT IS UNNECESSARY TO ADJUST UPPER AND LOWER DEFLECTORS |

FIG. 20B

| DEFLECTION ABERRATION EVALUATION RESULT |
|---|
| EVALUATION VALUE: 2.5<br><br>IT IS NECESSARY TO ADJUST UPPER AND LOWER DEFLECTORS |

FIG. 20C

| DEFLECTION ABERRATION EVALUATION RESULT | |
|---|---|
| EVALUATION VALUE: 2.5 | |
| IT IS NECESSARY TO ADJUST UPPER AND LOWER DEFLECTORS | START ADJUSTMENT |

| DEFLECTION CONTROL SIGNAL Y (LSB) | CORRECTION AMOUNT (LSB) |
|---|---|
| 0 | −378 |
| 1 | −375 |
| 2 | −371 |
| 3 | −388 |
| 4 | −385 |
| 5 | −383 |
| ⋮ | ⋮ |

FIG.25

CORRECTION MODE

| ITEM | ON/OFF |
|---|---|
| FOCAL POINT | ON |
| ASTIGMATIC POINT | OFF |
| DEFLECTION COLOR | ON |

CORRECTION MODE

| ITEM | ON/OFF | NUMBER OF SCANNING LINES |
|---|---|---|
| REGULAR INTERVAL | OFF | 5 |
| IRREGULAR INTERVAL | ON | 5 |

CHARGED-PARTICLE BEAM DEVICE

TECHNICAL FIELD

The present invention relates to a charged-particle beam device that inspects a semiconductor using a charged particle beam.

BACKGROUND ART

In the fabrication of a semiconductor micro circuit, fine patterns are formed in which pattern shapes drawn on a mask are transferred to a photosensitive resin (a resist) applied on the surface of a sample using a light source such as an ArF excimer laser. This is called a lithography process. For measurement (length measurement) for the dimension management of resist patterns formed in the lithography process, a scanning electron microscope (SEM) is generally used. The SEM is a device in which an electron beam emitted from an electron source is focused on the surface of a sample through an electron lens formed by a magnetic field or an electric field, the electron beam is deflected using a magnetic field or an electric field to scan the surface of the sample, and the electron beam is applied to detect secondary electrons emitted from the sample. Since the amount of secondary electrons to be emitted depends on the structure of the surface of the sample, the amounts of secondary electrons to be emitted for the individual application positions are displayed as an image, and the contrast reflecting the structure and material of the sample can be obtained. This image is called an SEM image. Since the electron beam can be focused as small as the order of nanometers, dimensional variations on the order of nanometers can be measured using the SEM, and the dimension management of fine patterns can be performed.

However, when fine resist patterns are observed using the SEM, a problem arises in that a resist is contracted (shrunk) caused by the application of an electron beam. Since the resist is shrunk, the pattern dimensions on an SEM image become smaller than the dimensions before SEM observation. On this account, an error is taken place on the value of length measurement. For a method for decreasing shrinkage, Patent Literature 1 discloses a method in which in the application of an electron beam, a scanning line spacing is set so as not to exceed an application density determined based on the physical properties of a sample.

Moreover, when such observation is performed that a scan area (a visual field) on the surface of a sample is a few tens microns or greater using an SEM, a problem arises in that a large aberration (deflection aberration) is taken place, which is caused by the deflection of an electron beam, and a large image blur or image distortion is taken place at the end of the visual field. For a method for decreasing an image blur or image distortion as described above, Patent Literature 2 discloses a method in which deflectors in two stages are used and the strengths and directions of the deflection magnetic fields produced in the deflectors are set to predetermined values. Furthermore, Patent Literature 3 discloses a method in which the deflection sensitivity and deflection direction of deflectors in two stages are linked to the size of a visual field for control.

In addition, Patent Literature 4 discloses a method in which a focal point or an astigmatic point is adjusted according to scan positions, and an image field curvature aberration and an astigmatism in deflection aberrations are corrected to decrease image blurs. However, the response speeds of a corrector using magnetic fields and the control circuit of the corrector, which are mounted on a typical SEM are slower than an adjusting method using electric fields, and it is not enabled to realize changing correction conditions at high speed. In other words, it is necessary to provide a method for decreasing deflection aberrations, which does not need high-speed focus correction or astigmatism control.

CITATION LIST

Patent Literature

PTL 1: International Publication WO/2003-021186
PTL 2: Japanese Patent Application Laid-Open No. Hei9 (1997)-167587
PTL 3: Japanese Patent Application Laid-Open No. Hei3 (1991)-173053
PTL 4: Japanese Patent Application Laid-Open No. 2006-173035

SUMMARY OF INVENTION

Technical Problem

In these years, as the consequence of the advanced downscaling of semiconductor circuit patterns, allowable length measurement errors become small, and the allowable amount of shrinkage also becomes small. Therefore, in order to satisfy the tolerance of length measurement errors for the cutting-edge of patterns, it is necessary that the pixel size in the Y-direction (the size on a sample corresponding to one pixel forming an SEM image) be expanded to a few tens nanometers or greater, for example, and the electron beam application density be decreased to suppress shrinkage. As a result, it is necessary that the visual field in the Y-direction be ten microns or greater. On the other hand, since it is necessary to make observations on the X-direction, which is a direction for length measurement, at the accuracy of the order of one nanometer, it is necessary that the pixel size in the X-direction be the size of about one nanometer.

However, when the size of the visual field is expanded in the Y-direction while making observations at high magnification in the X-direction (ten microns or greater, for example), an image blur or image distortion caused by a deflection aberration is revealed. In other words, an image blur or image distortion is taken place at the end portion of the visual field having a large amount of deflection of the electron beam as compared with the center part of the visual field. When an image blur is taken place, the length measurement result is changed, and the image blur is a factor of length measurement errors. Moreover, in the case where an image blur is extremely large, it is not enabled to distinguish the outlines of patterns, and it is not sometimes enabled to perform length measurement itself.

In order to address these problems, it is necessary to decrease deflection aberrations. FIG. 26 is a schematic diagram of the dependence of the amount of a deflection aberration on the amount of deflection. The amount of a deflection aberration becomes greater, as the absolute value of the amount of deflection becomes greater. A curve 2601 is the case where the amount of a deflection aberration is great, and a curve 2602 is the case where the amount of a deflection aberration is at the minimum. Patent Literature 2 and 3 do not provide a specific description of an evaluation method for a deflection aberration that combines measurement in the X-direction on the nanometer order with a large amount of deflection in the Y-direction. Moreover, the evaluation method for a deflection aberration is a method using low magnification observations typified by the size of 20 nanometers or greater, and no consideration is paid for an image blur or image distortion taken place in observations at high magnification in a certain direction as in the present application.

Solution to Problem

In view of the problems, a charged-particle beam device according to the present application is a charged-particle beam device including: a sample stage on which a sample is placed; a scanning optical system that scans a charged particle beam over the sample; a first deflector and a second deflector that deflect the charged particle beam; an image acquiring unit that acquires an image having a pixel size greater in a second direction than in a first direction based on electrons emitted from the sample; an image storage unit that stores a plurality of the images in which combination conditions of a deflection intensity ratio and a rotation angle for the first deflector and the second deflector are changed; and an evaluation unit that determines a combination of the deflection intensity ratio and the rotation angle for the first deflector and the second deflector based on a variation in the second direction in the stored plurality of the images.

Moreover, another charged-particle beam device according to the present application is a charged-particle beam device including: a sample stage on which a sample is placed; a scanning optical system that scans a charged particle beam over the sample; an aberration correction unit that corrects an aberration in the scanning optical system; a deflector that deflects the charged particle beam; an image acquiring unit that acquires an image having a pixel size greater in a second direction than in a first direction based on electrons emitted from the sample; and a control computing unit that calculates an amount to correct an aberration by the aberration correction unit based on the acquired amount of deflection in the second direction.

Advantageous Effects of Invention

It is possible to realize efficient measurement of line patterns using the present invention.

BRIEF DESCRIPTION OF DRAWINGS

FIG. 12 is an exemplary display of the evaluation result of a deflection aberration according to the second embodiment.
FIG. 13 is a flowchart of a third embodiment.
FIG. 16 is a flowchart of a fourth embodiment.
FIG. 17 is a schematic diagram of a visual field according to the fourth embodiment.
FIG. 20A is an exemplary display according to the fifth embodiment.
FIG. 20B is an exemplary display according to the fifth embodiment.
FIG. 20C is an exemplary display according to the fifth embodiment.
FIG. 25 is a GUI display that specifies correction conditions.

DESCRIPTION OF EMBODIMENTS

Figure 1A:
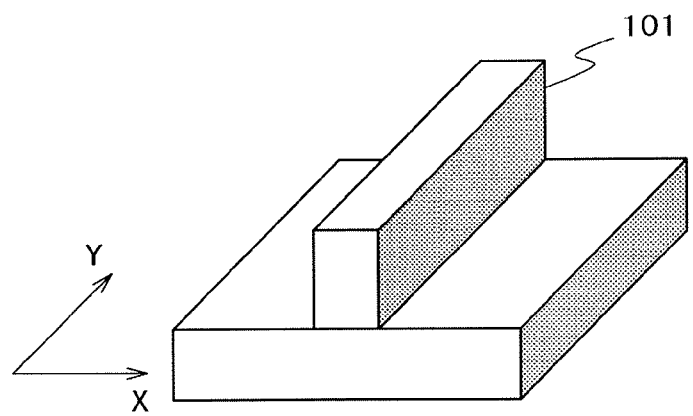
FIG. 1A is a schematic diagram of a resist line pattern.
Figure 1B:
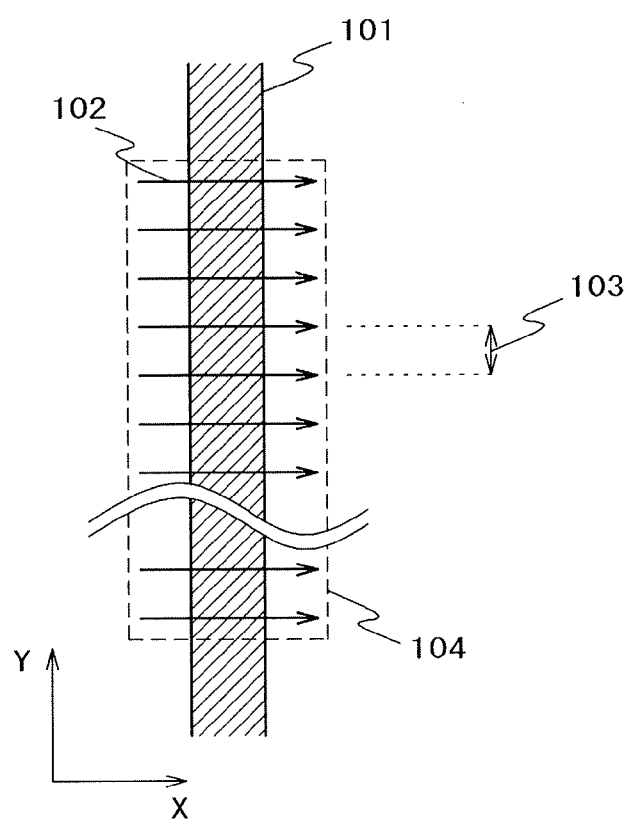
FIG. 1B is a schematic diagram of the resist line pattern and the scan position of an electron beam.

The present invention can be implemented in given forms as long as a device is a device that scans a charged particle beam to acquire an image. In the following, the description will be made as an SEM is taken as an example. Moreover, an arithmetic operation unit and a control unit described below will be separately described. However, it may be fine that a plurality of units is implemented using a single processor or a plurality of processors.

Moreover, the present invention also exerts effects on the following factors as well as shrinkage.

In other words, in these years, in the fabrication processes of the semiconductor micro circuit; a problem is the waviness of line patterns called wiggling. The cycle of wiggling in the Y-direction ranges on the order of a few tens nanometers to a few hundreds nanometers. In order to efficiently measure the wiggling using an SEM, it is necessary to expand the visual field in the Y-direction to ten microns or greater. On the other hand, similarly to the observation of resist patterns, it is necessary that the pixel size in the X-direction, which is the direction for length measurement, be the size of about one nanometer. Thus, when image distortion is taken place, the waviness of an apparent pattern caused by image distortion is taken place in addition to the inherent waviness of a pattern in wiggling measurement, and it is not enabled to accurately measure wiggling. Moreover, the application of an electron beam is possibly a factor of wiggling. Similarly to shrinkage, it is also effective to this wiggling problem that the visual field in the Y-direction is widely expanded to decrease the electron beam application density.

Furthermore, another factor is a problem in that a sample is charged by electron beam application. In these years, in the fabrication processes of the semiconductor micro circuit, insulating materials of a low electrical conductivity are becoming frequently used. When an electron beam is applied to an insulator, a problem arises in that a sample is charged to affect the track of a primary electron beam and the amount of secondary electrons to be emitted, and it is not enabled to correctly acquire an SEM image. In addition, an electric field in the inside of the sample due to electrification may cause dielectric breakdown on a part of the sample, or the pattern shape of the sample may be deformed due to Coulomb force, leading to the deterioration of the performance of a device. On the contrary, the electron beam application density can be more decreased as the visual field in the Y-direction is expanded as much as possible, and electrification can be decreased.

As described above, in order to perform highly accurate measurement with less damage to the sample such as shrinkage, wiggling, and electrification and to efficiently measure a phenomenon in a long cycle such as wiggling, such a necessity is emerging that length measurement of high resolution is performed in the X-direction on the order of nanometers while expanding the size of the visual field in the Y-direction to ten microns or greater.

Example 1

As an exemplary embodiment of a first method for solving the problems, an SEM will be described in which an image blur caused by a deflection aberration is highly accurately measured using an SEM image that the pixel size in the Y-direction is greater than the pixel size in the X-direction (in other words, the scaling factor is greater in the Y-direction than in the X-direction) and the optimum intensity ratio and rotation angle of a two-stage deflector are set. In the embodiment, with the use of the fact that the length measurement value of a line pattern is changed because of a deflection aberration, the size of a deflection aberration is evaluated from a variation in the length measurement value in the image.

Figure 2:
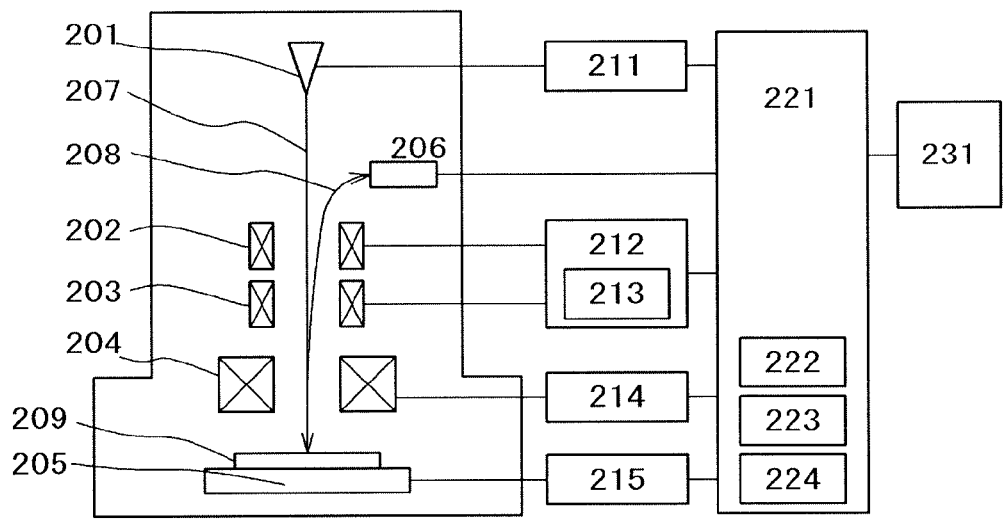
FIG. 2 is a schematic diagram of an overall configuration of an SEM according to a first embodiment.

FIG. 2 is a schematic diagram of an overall configuration of an SEM according to the embodiment. A primary electron beam 207 emitted from an electron gun 201 controlled by an electron gun control unit 211 converges to the surface of a sample 209 placed on a stage 205 for application. The focal point of the primary electron beam is adjusted by an objective lens control unit 214 to control the amperage of a current applied to an objective lens 204 or by a retarding control unit 215 to control a retarding voltage applied to the stage 205.

Secondary electrons 208 emitted from the surface of the sample by the application of the primary electron beam 207 are detected at a detector 206. Electric currents applied to an upper deflector 202 and a lower deflector 203 are controlled by a two-stage deflector control unit 212, so that the primary electron beam 207 can be scanned over the surface of the sample. The two-stage deflector control unit 212 includes an upper and lower stage settings storage unit 213, and controls the electric currents of these deflectors in such a manner that the intensity ratios and rotation angles of the upper deflector 202 and the lower deflector 203, which are deflectors in two stages, take set values stored on the upper stage setting storage unit 213.

A control arithmetic and logic unit 221 that controls the overall device includes a processor that processes control programs describing operation procedures and the like registered in advance, and sends control signals to the control units. Moreover, the control arithmetic and logic unit 221 is connected to the detector 206 as well, and receives a signal of the intensity of the secondary electrons as a detection signal. Furthermore, the control arithmetic and logic unit 221 generates an SEM image based on the control signal sent to the two-stage deflector control unit 212 and the detection signal received from the detector 206, and stores the image on an image storage unit 223. Alternatively, the control arithmetic and logic unit 221 can display the generated SEM image on a display device 231 as well. In addition, the control arithmetic and logic unit 221 includes a deflection aberration evaluation unit 222 that calculates the evaluation value of a deflection aberration using an image stored on the image storage unit 223. Moreover, the control arithmetic and logic unit 221 includes a search condition storage unit 224 that stores a plurality of the combination conditions for the intensity ratio and the rotation angle and the evaluation values of a deflection aberration under the conditions.

It is noted that in the embodiment, the case is described where the upper deflector 202 and the lower deflector 203 are electromagnetic deflectors that deflect the primary electron beam 207 with a magnetic field produced from an electric current. However, it may be fine that one or both of the upper deflector 202 and the lower deflector 203 are electromagnetic deflectors that deflect the primary electron beam 207 with an electric field. Moreover, an electrostatic lens or an electromagnetic lens other than the objective lens, an astigmatism corrector that corrects the astigmatism of the primary electron beam 207, and deflectors that deflect the primary electron beam 207 other than the upper deflector 202 and the lower deflector 203 are omitted in FIG. 2. However, it may be fine that these components are included. Furthermore, it may be fine that a component acting on other electron beams is included. In addition, it may be fine that electrons detected at the detector 206 are secondary electrons as well as reflected electrons and electrons that secondary electrons emitted from the surface of the sample or reflected electrons are entered to the component of the SEM (the objective lens and the like, for example) to produce electrons consequently (so-called tertiary electrons).

Figure 3:
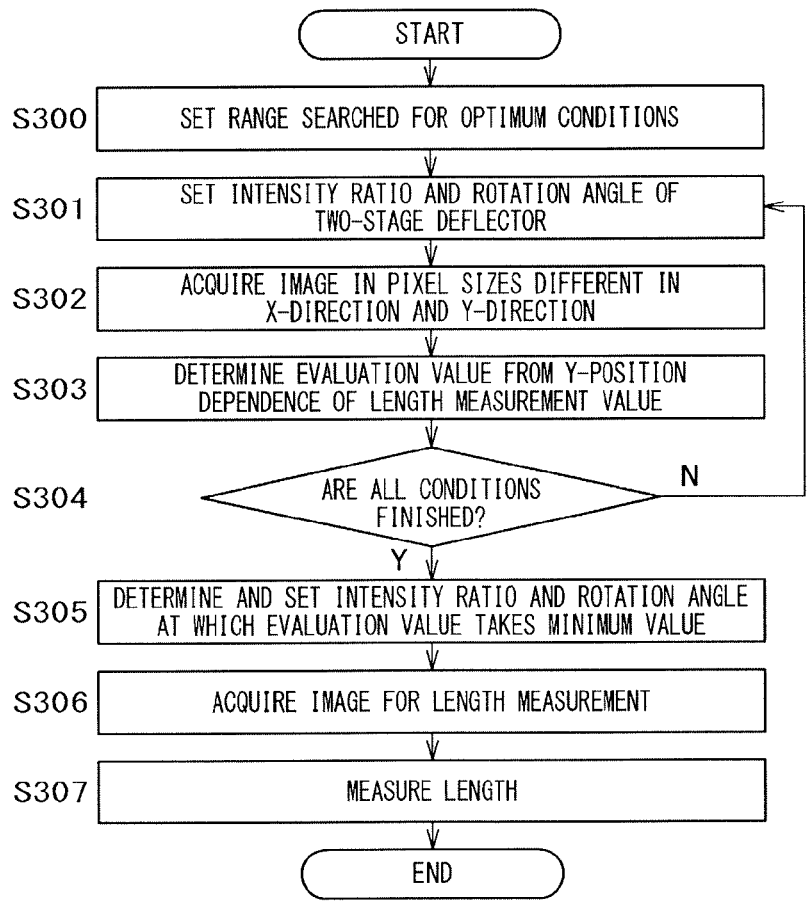
FIG. 3 is a flowchart of the first embodiment.

FIG. 3 is a flowchart of the embodiment. In the following, the description will be made along the flowchart.

Figure 4:
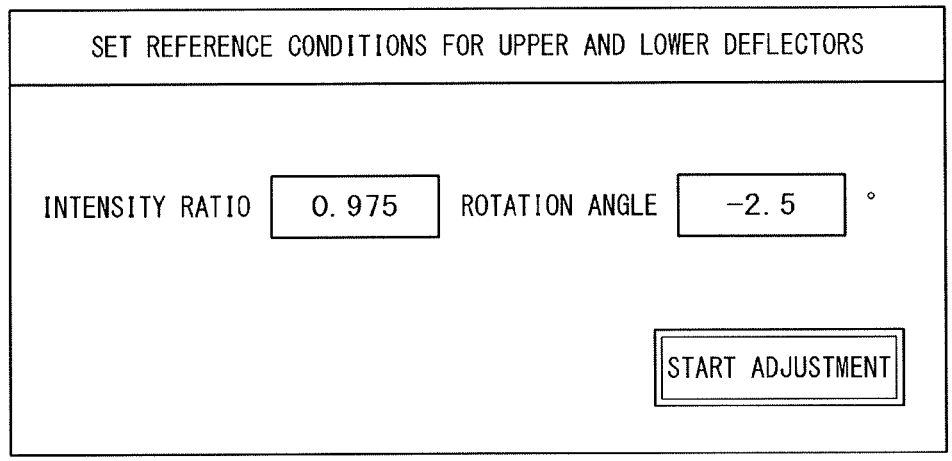
FIG. 4 is an exemplary display according to the first embodiment.

In Step S300, for a range of searching the optimum conditions for the combination conditions of the set values of the intensity ratios and rotation angles of the upper deflector 202 and the lower deflector 203, which are deflectors in two stages, a plurality of combination conditions is stored on the search condition storage unit 224. The conditions to be stored are a plurality of conditions having the values of the intensity ratio and the rotation angle close to predetermined reference conditions. It may be fine that the reference conditions are the combination conditions of the intensity ratio and the rotation angle used in the device before performing this flowchart, that is, the conditions stored on the upper and lower stage settings storage unit 213 before performing the flowchart, it may be fine that the reference conditions are the conditions in which a display to prompt inputting reference conditions illustrated in FIG. 4 to the display device 231 and the reference conditions are inputted and determined by an operator, or it may be fine that the reference conditions are values determined by the calculation made by an electro-optical system. It may be fine that in the case where referenceable conditions as described are not available, the reference conditions are set as the intensity ratio is one and the rotation angle is an angle of 180°. It is noted that it may be fine that in the case where the search conditions are recorded in advance on the search condition storage unit 224, these steps are omitted.

In Step S301, the control arithmetic and logic unit 221 is used to read one of the combination conditions stored on the search condition storage unit 225, and the combination condition is recorded on the upper and lower stage settings storage unit 213 for the set values of the intensity ratios and rotation angles of the upper deflector 202 and the lower deflector 203, which are deflectors in two stages.

In Step S302, the control arithmetic and logic unit 221 is used to send a control signal to the two-stage deflector control unit 212, the primary electron beam 207 is deflected by the upper deflector 202 and the lower deflector 203 to detect secondary electrons at the detector 206 while scanning the surface of the sample, SEM image data in a line-shaped pattern as illustrated in FIG. 1A is generated using the detection signal, and the SEM image data is stored on the image storage unit 223. In the processing, the two-stage deflector control unit 212 controls the upper deflector 202 and the lower deflector 203 based on the intensity ratios and the rotation angles stored on the upper and lower stage settings storage unit 213. Moreover, the two-stage deflector control unit 212 sends a control signal in such a manner that the pixel size of the SEM image to be generated in the Y-direction is greater than the pixel size in the X-direction. It is noted that it may be fine that a plurality of line patterns is included in the visual field in which an SEM image is acquired.

In Step S303, the deflection aberration evaluation unit 222 is used to read an image stored on the image storage unit 223, and the Y-position dependence of the dimensions of the line pattern is measured. In the measurement of the pattern dimensions at a certain Y-position, the X-position dependence of the image luminance at that Y-position (a luminance profile) is determined, and the pattern dimensions are measured from the luminance profile. A measurement method for dimensions may be a given method as long as the method is a method that measures pattern dimensions from the luminance profile of an SEM image such as a threshold method. Moreover, in order to improve the signal-to-noise ratio of the luminance profile, it may be fine that luminance profiles near the Y-position at which measurement is made are averaged for length measurement using the averaged luminance profile. Furthermore, it may be fine that in the case where a plurality of line patterns is included in an image, a value is used in which the dimensions of the line patterns are measured and averaged.

Figure 5:
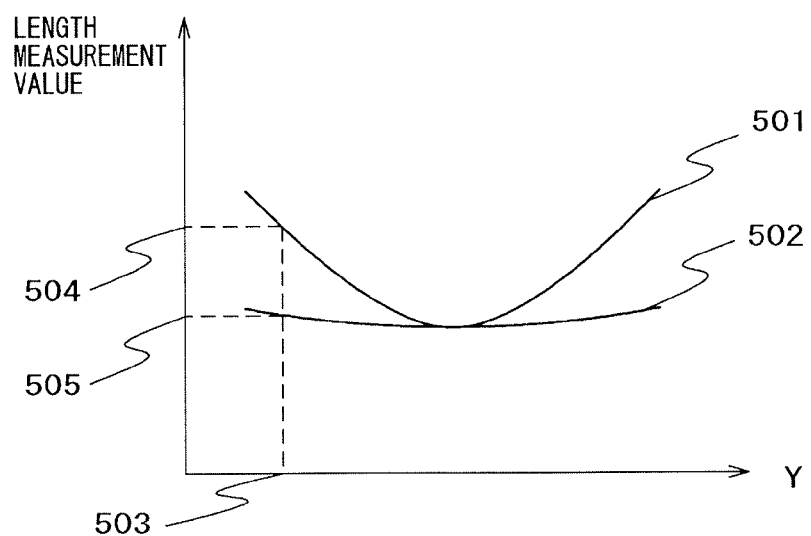
FIG. 5 is the Y-position dependence of length measurement values.
Figure 26:
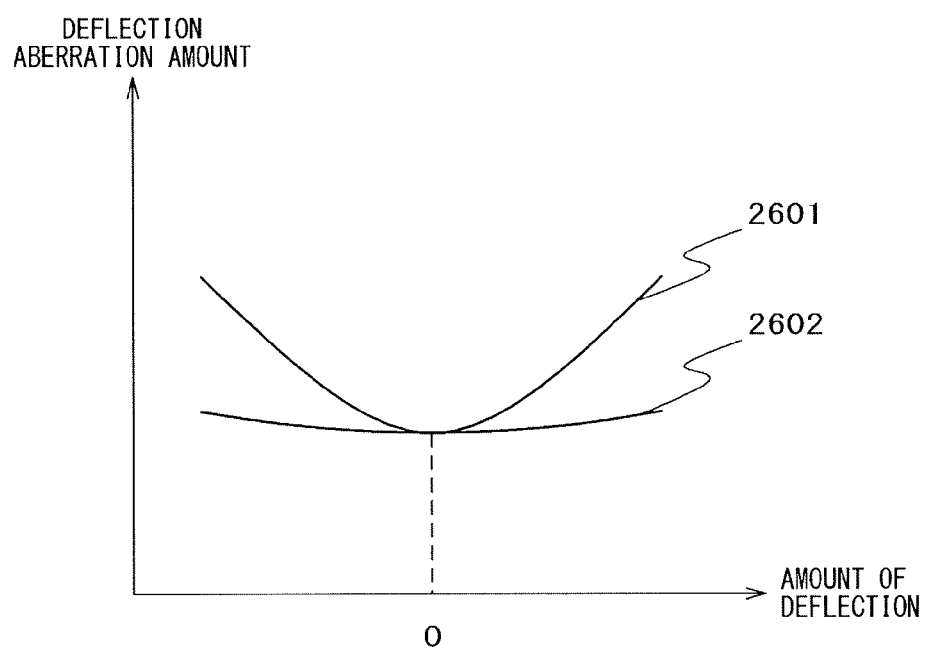
FIG. 26 is a schematic diagram of the dependence of a deflection aberration on the amount of deflection.

Since the visual field in the Y-direction is greater than the visual field in the X-direction in the SEM image stored in Step S302, the amount of deflection of the primary electron beam in the acquisition of the image is relatively greater than the amount of deflection in the X-direction as the primary electron beam comes closer to the upper and lower ends of the visual field. As illustrated in FIG. 26, a deflection aberration is more increased as the amount of deflection becomes greater. When a deflection aberration is increased, the length measurement value of the line pattern is changed due to an image blur caused by a deflection aberration, and the Y-position dependence of the length measurement value takes curves as illustrated in FIG. 5. A curve 501 depicts the case where a deflection aberration is large, and a curve 502 depicts the case where a deflection aberration is small.

Therefore, the curvatures of these curves are determined, and the degree of a deflection aberration can be quantitatively evaluated. More specifically, the obtained Y-position dependence of the length measurement value is subjected to second order approximation to determine a second order coefficient, and the second order coefficient is stored as the evaluation value of a deflection aberration on the search condition storage unit 224. Moreover, in this SEM image, the pixel size in the X-direction is small, and even a slight difference in the pattern dimensions can be highly accurately detected. Therefore, by the method in this step, even a slight change in the amount of a deflection aberration can be highly accurately detected. It may be fine that as illustrated in FIG. 6, a display showing the SEM image stored on the image storage unit 223, the Y-position dependence of the pattern dimensions, and the evaluation value is displayed on the display device 231, and the measurement result of a deflection aberration is told to the operator as necessary.

It is noted that for the determination method for the evaluation value, a given method may be used as long as the method is a method that quantifies the degree of a change in the length measurement value in the Y-direction. For example, it may be fine that a difference between the length measurement value in the center of the image and the length measurement value at the top end of the image or the length measurement value at the lower end of the image or the mean value of the length measurement values at both ends is simply considered to be an evaluation value, or it may be fine that a difference between the minimum value and the maximum value of the Y-position dependence of the length measurement value is used.

Alternatively, for another method, it may be fine that simply a length measurement value 504 at a constant Y-position 503 that is not the center of a certain visual field or the length measurement value 504 is calculated as an evaluation value, not to determine the second order coefficient of the Y-position dependence of the length measurement value. The method described above is determined according to the length measurement conditions or the demanded accuracy.

Figures 6, 7:
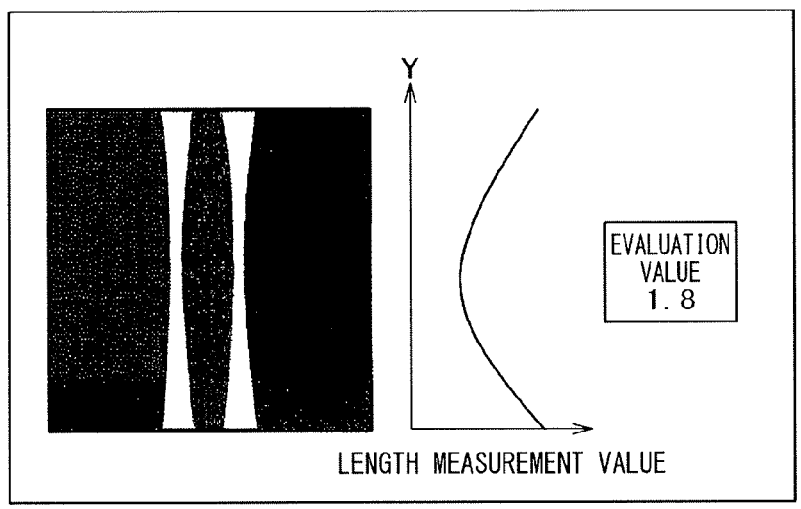
FIG. 6 is an exemplary display of the evaluation result of a deflection aberration according to the first embodiment.
FIG. 7 is a table of intensity ratios, rotation angles, and measured evaluation values.

On the search condition storage unit 224 that stores the obtained evaluation value, data as illustrated in FIG. 7 is stored together with the intensity ratio and the rotation angle stored in Step S300.

Figure 8:
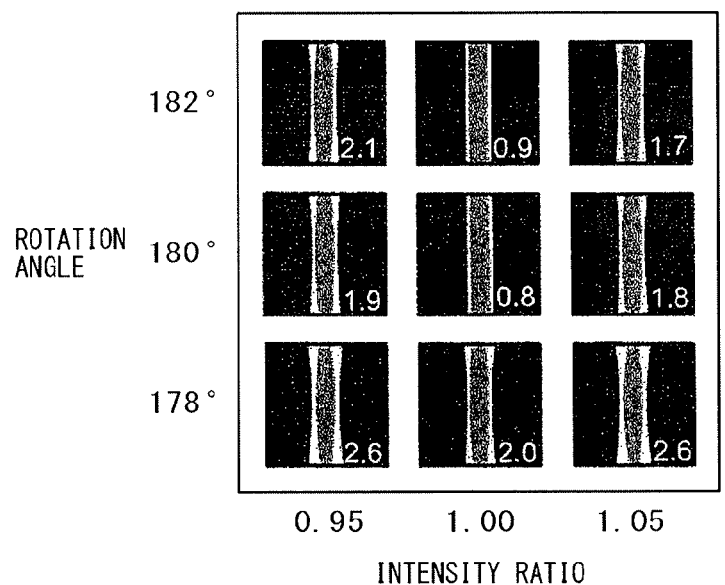
FIG. 8 is an exemplary display of the measurement result of a deflection aberration according to the first embodiment.
Figure 9:
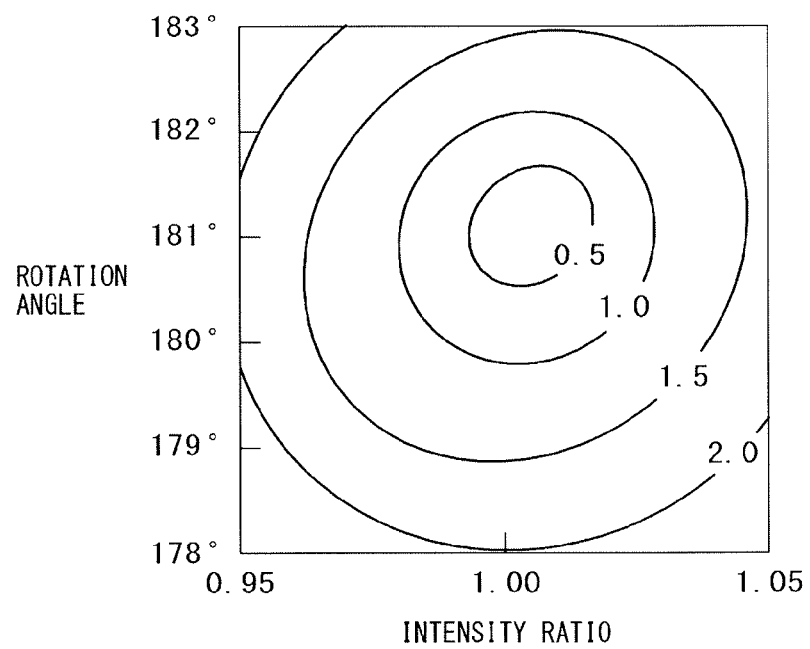
FIG. 9 is an exemplary display of the measurement result of a deflection aberration according to the first embodiment.

In Step S304, it is determined whether the calculation of the evaluation value is finished on all the conditions for the combination conditions of the intensity ratio and the rotation angle stored on the search condition storage unit 224. In the case where the calculation is not finished, the process is returned to Step S301, and the subsequent combination condition of the intensity ratio and the rotation angle is set. In the case where the calculation is finished, the process goes to Step S305. It is noted that it may be fine that in this step, a display in a table format as illustrated in FIG. 7, a display in a mapping format as illustrated in FIG. 8, or a display in a contour line format as illustrated in FIG. 9 is displayed on the display device 231 and the measurement result is told to the operator.

In Step S305, the control arithmetic and logic unit 221 is used to select the conditions that the evaluation value is at the minimum in the combination conditions of the intensity ratio and the rotation angle stored on the search condition storage unit 224, and the conditions are stored on the upper and lower stage settings storage unit 213. Alternatively, it may be fine that the dependence of the evaluation value on the intensity ratio and the rotation angle are fit, and the conditions of the intensity ratio and the rotation angle under which the evaluation value is at the minimum are determined from the fitting function, and the conditions are stored on the upper and lower stage settings storage unit 213. By the method using this fitting, the evaluation result of discrete conditions stored on the search condition storage unit 224 is used and the conditions are complemented to determine the optimum conditions.

In Step S306, the control arithmetic and logic unit 221 is used to send a control signal to the two-stage deflector control unit 212, the primary electron beam 207 is deflected using the upper deflector 202 and the lower deflector 203 to detect secondary electrons at the detector 206 while scanning the surface of the sample, and SEM image data of a pattern to which length measurement is desired to be performed is generated using the detection signals, and stored on the image storage unit 223. In the processing, the two-stage deflector control unit 212 controls the upper deflector 202 and the lower deflector 203 based on the conditions stored on the upper and lower stage settings storage unit 213 in Step S305. It is fine that the pixel size of the SEM image to be generated is freely set according to the purpose of length measurement. For example, in the case where the purpose is a decrease in the shrinkage of a resist pattern in length measurement or the efficient measurement of the wiggling of a line pattern, a control signal is sent in such a manner that the pixel size of the SEM image in the Y-direction is greater than the pixel size in the X-direction. In the case where this image is acquired, the visual field is greatly extended in the Y-direction, leading to a risk that an image blur due to the influence of a deflection aberration is revealed. However, a deflection aberration is small under the conditions of the intensity ratio and the rotation angle stored on the upper and lower stage settings storage unit 213, so that an SEM image with a decreased image blur can be obtained.

In Step S307, the control arithmetic and logic unit 221 is used to read an image stored on the image storage unit 223 in Step S306 for length measurement.

In the flowchart described above, the description is made as the case is taken as an example where the pixel size in the Y-direction is made greater than the pixel size in the X-direction. However, on the other hand, also in the case where the pixel size in the X-direction is greater than the pixel size in the Y-direction, it is possible to highly accurately measure an image blur caused by a deflection aberration by a similar method, and to find the optimum conditions for the intensity ratio and the rotation angle.

It is noted that this flowchart is a flowchart in which the optimum intensity ratio and the optimum rotation angle are determined and the conditions are set to the device to acquire an SEM image for length measurement. However, it may be fine that a part of the processes is performed. For example, it may be fine that the processes up to S305 are performed, that is, the processes up to the process that the conditions of the optimum intensity ratio and the optimum rotation angle are stored on the upper and lower stage settings storage unit 213 are performed. Thus, when the subsequent image is acquired, the stored settings are read to acquire an SEM image of a small image blur caused by a deflection aberration.

With the use of the method described above, it is possible to suppress image blurs caused by a deflection aberration at the upper and lower ends of the visual field when the size of the visual field in the Y-direction is greatly expanded, and it is possible to perform length measurement of high resolution in the X-direction. Moreover, in many electro-optical systems, the conditions of the intensity ratio and the rotation angle with a small image blur caused by a deflection aberration are nearly matched with the conditions with a small image distortion caused by a deflection aberration, so that it is possible to suppress image distortion caused by a deflection aberration as well. Thus, it is possible to implement a decrease in damage to the sample in the acquisition of an SEM image and the efficient measurement of a phenomenon in a long cycle such as wiggling. This method is unnecessary to provide an offset on the deflection signal in the acquisition of the image, and can be implemented by only changing the amplitude gain of the deflection signal, and can simplify control.

Example 2

As another exemplary embodiment of the first method for solving the problems, an SEM will be described in which misalignment in association with deflection is highly accurately measured using an SEM image that the pixel size in the Y-direction is greater than the pixel size in the X-direction to set the optimum intensity ratio and rotation angle of a two-stage deflector.

Here, the misalignment means a variation in the application position of a primary electron beam when the focal position is changed by a certain amount. When a unit that changes the focal position is different, the amount of misalignment is also different. For example, in the case where a unit that changes the focal position is a retarding voltage, the variation is called the amount of misalignment from the center of retarding.

Generally, in the case where a primary electron beam is not deflected, the track of the primary electron beam is adjusted so as not to take place misalignment. However, generally, in the case where a primary electron beam is deflected, misalignment is taken place according to the amount of deflection. In the case where a primary electron beam is deflected using a two-stage deflector, the amount of misalignment depends on the intensity ratio and rotation angle of the two-stage deflector.

In a part of electro-optical systems, the conditions of the intensity ratio and rotation angle of the two-stage deflector under which an image blur or image distortion caused by a deflection aberration is at the minimum are nearly matched with the conditions under which the amount of misalignment from the center of retarding is at the minimum in association with deflection. Therefore, the measured amount of misalignment in association with the deflection is considered to be the evaluation value of a deflection aberration, the intensity ratio and rotation angle of the two-stage deflector under which the evaluation value is at the minimum are determined, and the conditions are set, so that an image blur or image distortion caused by a deflection aberration can be decreased. Here, an embodiment of an electro-optical system like one described above will be described, and to an electro-optical system in which the conditions under which an image blur or image distortion caused by a deflection aberration is at the minimum are nearly matched with the conditions under which the amount of misalignment measured at another focal position changing unit is at the minimum, a focal position changing unit corresponding to the electro-optical system is used, so that a similar method is applicable.

A schematic diagram of an overall configuration of an SEM according to the embodiment is similar to FIG. 2 except the portions described later.

Figure 10:
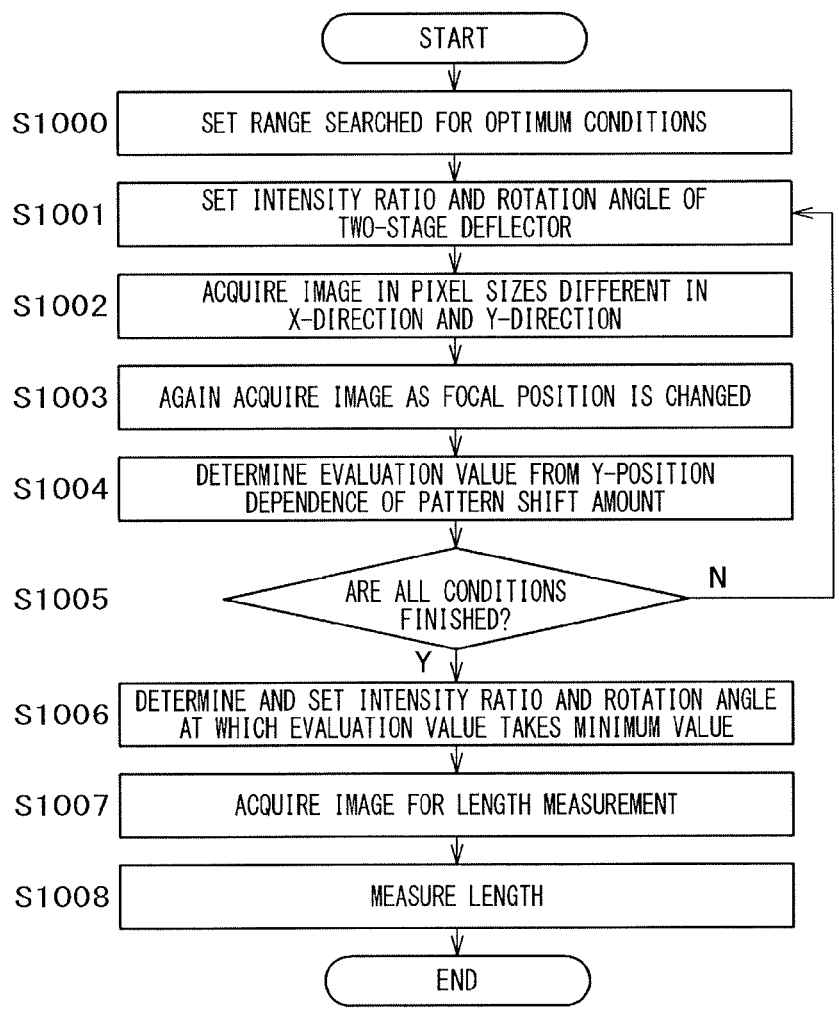
FIG. 10 is a flowchart of a second embodiment.

FIG. 10 is a flowchart of the embodiment. In the following, the description will be made along the flowchart.

Steps S1000 to S1002 are similar to Steps S300 to S302.

In Step S1003, the control arithmetic and logic unit 221 is used to send a control signal to the retarding control unit 212, a retarding voltage applied to the stage 205 is changed to change the focal position, an operation similar to the operation in Step S1002 is performed to generate SEM image data, and the SEM image data is stored on the image storage unit 223.

Figure 11:
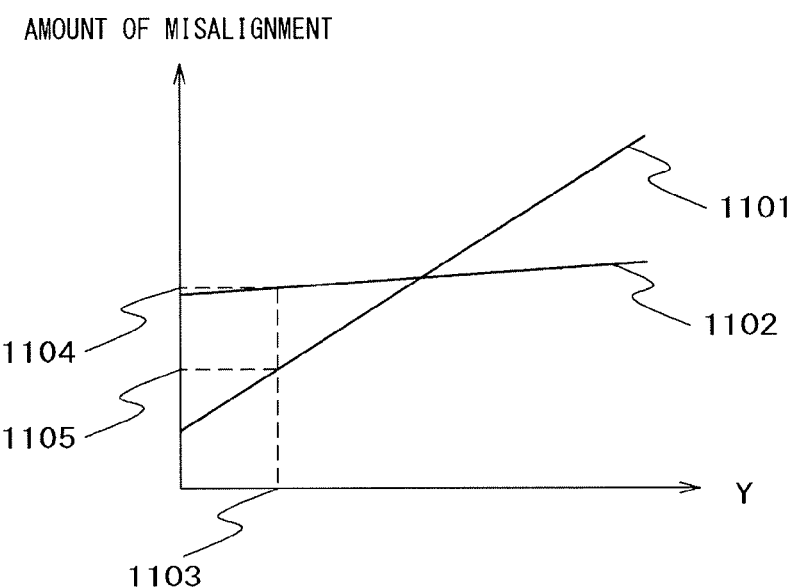
FIG. 11 is the Y-position dependence of the amount of misalignment.

In Step S1004, the deflection aberration evaluation unit 222 is used to read two SEM images stored on the image storage unit 223, and the Y-position dependence of the amount of misalignment is measured as illustrated in FIG. 11. A plot 1101 is the amount of misalignment in the case where a deflection aberration is large, and a plot 1102 is the amount of misalignment in the case where a deflection aberration is small. The amount of misalignment can be measured by comparing the luminance profiles of two images at the same Y-position with each other and calculating the shift amount in the X-direction. For the calculation method for a shift amount, it may be fine that a normalized correlation method is used, or it may be fine that a calculation method is used in which peak positions on the profiles are determined and the difference between the positions is considered to be a shift amount. A given method may be fine as long as the method is a method in which the shift amount of the pattern positions is calculated from two luminance profiles. Moreover, in order to improve the signal-to-noise ratio of the luminance profile, it may be fine that luminance profiles near the Y-position at which measurement is made are averaged and the averaged value is used to calculate a shift amount.

Figure 27:
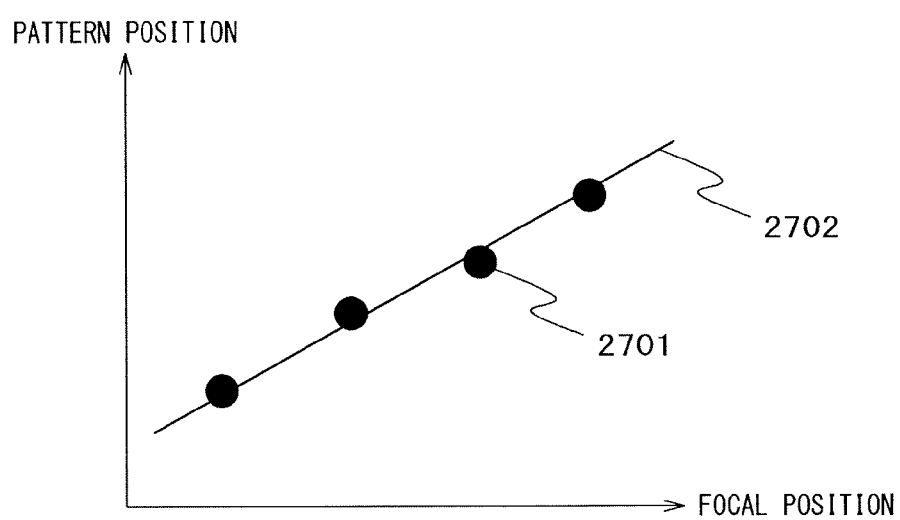
FIG. 27 is an illustration of a calculation method for the amount of misalignment.

Furthermore, for the determination method for the amount of misalignment, it may be fine that instead of using two SEM images, three SEM images or more with different focal positions are used, the relationship between pattern positions at the same Y-positions on the images and the focal positions of the pattern positions is subjected to linear approximation, and the first order coefficient of the linear approximation is considered to be the amount of misalignment. In other words, the method is a method in which a relationship 2701 between the pattern position and the focal position as illustrated in FIG. 27 is determined from three SEM images or more, and the slope of an approximation straight line 2702 is considered to be the amount of misalignment. Three images or more are used, so that the measured accuracy of the amount of misalignment can be improved.

The obtained Y-position dependence of the amount of misalignment is subjected to linear approximation to determine a first order coefficient, and the first order coefficient is considered to be an evaluation value and stored on the search condition storage unit 224. Since the visual field in the Y-direction is greater than the visual field in the X-direction in the SEM images stored in Steps S1002 and S1003, the amount of deflection of the primary electron beam is more increased in the acquisition of the images as the primary electron beam comes closer to the upper and lower ends of the visual field, and the amount of misalignment is increased in association with deflection. On the other hand, in the SEM images, the pixel size in the X-direction is small, and even a slight misalignment can also be highly accurately detected. It may be fine that a display showing two SEM images stored on the image storage unit 223, the Y-position dependence of the amount of misalignment, and the evaluation value as illustrated in FIG. 12 is displayed on the display device 231 and the measurement result is told to the operator as necessary.

Alternatively, for another method, it may be fine that a misalignment amount 1104 or a misalignment amount 1105 at a constant Y-position 1103 that is not the center of a certain visual field is simply calculated as an evaluation value, not to determine the first order coefficient of the Y-position dependence of the length measurement value.

On the search condition storage unit 224 that stores the obtained evaluation value, similarly to Step S303 according to the first embodiment, data as illustrated in FIG. 7 is stored together with the intensity ratio and the rotation angle stored in Step S1000. It is noted that for the determination method for the evaluation value, a given method may be used as long as the method is a method that quantifies the degree of a change in the amount of misalignment in the Y-direction. For example, it may be fine that a difference between the amount of misalignment in the center of the image and the amount of misalignment at the top end of the image or the amount of misalignment at the lower end of the image or the mean value of the amounts of misalignment at both ends is simply considered to be an evaluation value, or it may be fine that a difference between the minimum value and the maximum value of the Y-position dependence of the amount of misalignment is used.

Steps S1005 to S1008 are similar to Steps S304 to S307.

In the flowchart described above, the description is made as the case is taken as an example where the pixel size in the Y-direction is made greater than the pixel size in the X-direction. However, on the other hand, also in the case where the pixel size in the X-direction is greater than the pixel size in the Y-direction, it is possible to highly accurately measure the misalignment in association with deflection by a similar method, and to find the optimum conditions for the intensity ratio and the rotation angle.

It is noted that this flowchart is a flowchart in which the optimum intensity ratio and the optimum rotation angle are determined and the conditions are set to the device to acquire an SEM image for length measurement. However, it may be fine that a part of the processes is performed. For example, it may be fine that the processes up to S1006 are performed, that is, the processes up to the process that the conditions of the optimum intensity ratio and the optimum rotation angle are stored on the upper and lower stage settings storage unit 213 are performed. Thus, when the subsequent image is acquired, the stored settings are read, so that it is possible to acquire an SEM image with a small image blur or image distortion caused by a deflection aberration.

With the use of the method described above, it is possible to suppress image blurs or image distortion caused by a deflection aberration at the upper and lower ends of the visual field when the size of the visual field in the Y-direction is greatly expanded, and it is possible to perform length measurement of high resolution in the X-direction. In particular, the method according to the embodiment exerts the effect on a decrease in damage to the sample in the acquisition of an SEM image and the efficient measurement of a phenomenon in a long cycle such as wiggling.

Example 3

As another exemplary embodiment of the first method for solving the problems, an SEM will be described in which image distortion caused by a deflection aberration is highly accurately measured using an SEM image that the pixel size in the Y-direction is greater than the pixel size in the X-direction to set the optimum intensity ratio and rotation angle of a two-stage deflector.

A schematic diagram of an overall configuration of an SEM according to the embodiment is similar to FIG. 2 except the portions described later.

FIG. 13 is a flowchart of the embodiment. In the following, the description will be made along the flowchart.

Steps S1300 to S1302 are similar to Steps S300 to S302.

Figure 14:
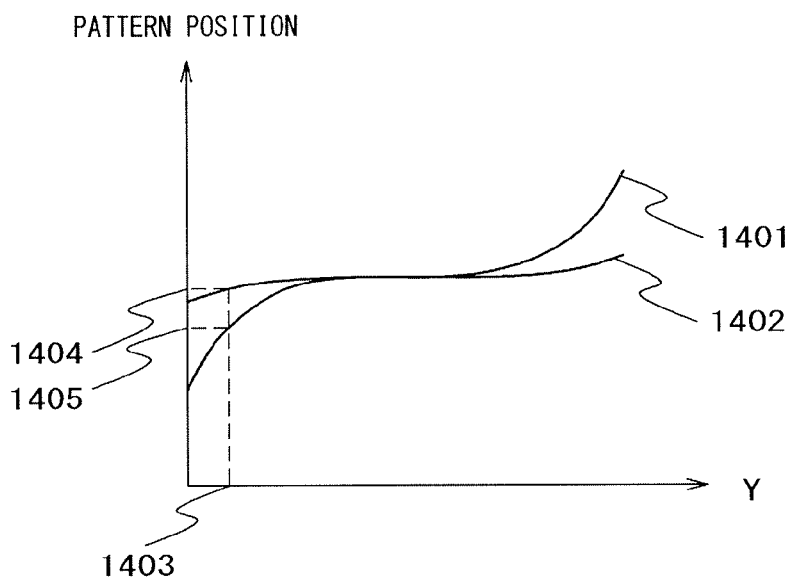
FIG. 14 is the Y-position dependence of a pattern position.

In Step S1303, the deflection aberration evaluation unit 222 is used to read an image stored on the image storage unit 223, and the Y-position dependence of the line pattern position is measured as illustrated in FIG. 14. A plot 1401 is the Y-position dependence of the pattern position in the case where a deflection aberration is large, and a plot 1402 is the Y-position dependence of the pattern position in the case where a deflection aberration is small. When the pattern dimensions at a certain Y-position are measured, the X-position dependence of the image luminance at that Y-position (a luminance profile) is determined, and the pattern position is measured from the luminance profile. For the measurement method for the pattern position, a given method may be fine as long as the method is a method that measures the pattern position from the luminance profile of an SEM image such as a threshold method. Moreover, it may be fine that in order to improve the signal-to-noise ratio of the luminance profile, luminance profiles near the Y-position at which measurement is made are averaged and the averaged value is used to measure the pattern position. Furthermore, in the case where a plurality of line patterns is included in an image, it may be fine that the positions of the line patterns are measured and the averaged value is used.

Figure 15:
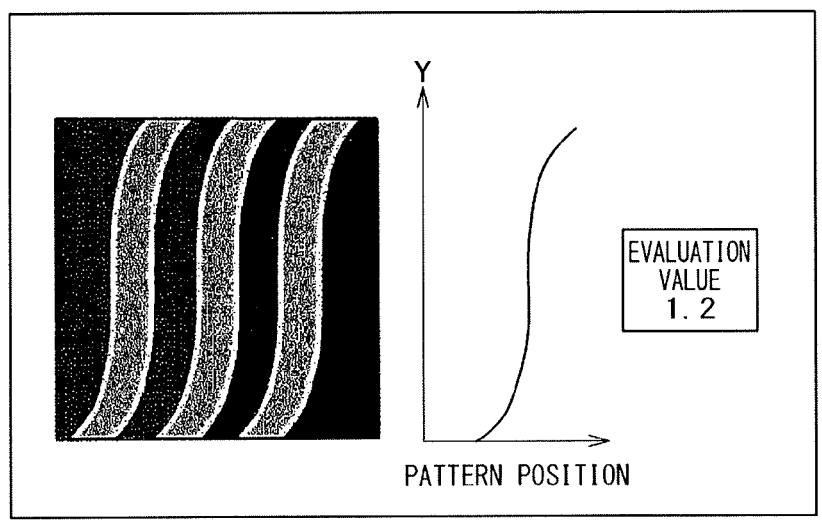
FIG. 15 is an exemplary display of the evaluation result of a deflection aberration according to the third embodiment.

The Y-position dependence of the obtained pattern position is subjected to third order approximation to determine a third order coefficient, and the third order coefficient is considered to be the evaluation value of a deflection aberration and stored on the search condition storage unit 224. Since the visual field in the Y-direction is greater than the visual field in the X-direction in the SEM image stored in Step S1302, the amount of deflection of the primary electron beam is more increased in the acquisition of the image as the primary electron beam comes closer to the upper and lower ends of the visual field, and a deflection aberration is increased. The position of the line pattern is changed in proportion to the cubic of the amount of deflection due to image distortion caused by a deflection aberration, so that the degree of a deflection aberration can be quantitatively evaluated from the Y-position dependence of the pattern position. Moreover, in this SEM image, the pixel size in the X-direction is small, so that even a slight difference at the pattern position can also be highly accurately detected. Therefore, by the method in this step, even a slight change in the amount of a deflection aberration can be highly accurately detected. It may be fine that a display showing the SEM image stored on the image storage unit 223, the Y-position dependence of the pattern position, and the evaluation value as illustrated in FIG. 15 is displayed on the display device 231 and the measurement result is told to the operator as necessary.

Alternatively, for another method, it may be fine that a pattern position 1404 or a pattern position 1405 at a constant Y-position 1403 that is not the center of a certain visual field is simply calculated as an evaluation value, not to determine the third order coefficient of the Y-position dependence of the length measurement value.

On the search condition storage unit 224 that stores the obtained evaluation value, similarly to Step S303 according to the first embodiment, data as illustrated in FIG. 7 is stored together with the intensity ratio and the rotation angle stored in Step S1300. It is noted that for the determination method for the evaluation value, a given method may be used as long as the method is a method that quantifies the degree of a change at the pattern position in the Y-direction.

Steps S1304 to S1307 are similar to Steps S304 to S307.

In the flowchart described above, the description is made as the case is taken as an example where the pixel size in the Y-direction is made greater than the pixel size in the X-direction. However, on the other hand, also in the case where the pixel size in the X-direction is greater than the pixel size in the Y-direction, it is possible to measure image distortion caused by a deflection aberration by a similar method, and to find the optimum conditions for the intensity ratio and the rotation angle.

It is noted that this flowchart is a flowchart in which the optimum intensity ratio and the optimum rotation angle are determined and the conditions are set to the device to acquire an SEM image for length measurement. However, it may be fine that a part of the processes is performed. For example, it may be fine that the processes up to S1305 are performed, that is, the processes up to the process that the conditions of the optimum intensity ratio and the optimum rotation angle are stored on the upper and lower stage settings storage unit 213 are performed. Thus, when the subsequent image is acquired, the stored settings are read, so that it is possible to acquire an SEM image with a small image distortion caused by a deflection aberration.

With the use of the method described above, it is possible to suppress image distortion at the upper and lower ends of the visual field caused by a deflection aberration when the size of the visual field in the Y-direction is greatly expanded, and it is possible to perform length measurement of high resolution in the X-direction. In particular, the method according to the embodiment is the most effective to a decrease in image distortion. Thus, it is possible to implement efficient, highly accurate measurement of a phenomenon in a long cycle such as wiggling. Moreover, in many electro-optical systems, the conditions of the intensity ratio and the rotation angle with a small image distortion caused by a deflection aberration are nearly matched with the conditions with a small image blur caused by a deflection aberration, so that it is possible to suppress an image blur caused by a deflection aberration as well. Thus, it is possible to implement highly accurate measurement while decreasing damage to the sample in the acquisition of an SEM image.

Example 4

As an exemplary embodiment of a second method for solving the problems, an SEM will be described in which an image blur caused by a deflection aberration is highly accurately measured using an SEM image acquired in the state in which an offset is provided on the amount of deflection to set the optimum intensity ratio and rotation angle of a two-stage deflector.

A schematic diagram of an overall configuration of an SEM according to the embodiment is similar to FIG. 2 except the portions described later.

FIG. 16 is a flowchart of the embodiment. In the following, the description will be made along the flowchart.

Steps S1600 and S1601 are similar to Steps S300 and S301.

In Step S1602, the control arithmetic and logic unit 221 is used to send a control signal to the two-stage deflector control unit 212, the primary electron beam 207 is deflected using the upper deflector 202 and the lower deflector 203 to detect secondary electrons at the detector 206 while scanning the surface of the sample, and SEM image data is generated and stored on the image storage unit 223. In the processing, the two-stage deflector control unit 212 controls the upper deflector 202 and the lower deflector 203 based on the intensity ratios and the rotation angles stored on the upper and lower stage settings storage unit 213. Moreover, control is performed in such a manner that the amount of deflection in the center of the visual field is large on the order of a few microns, for example, not zero, and an offset is provided on an electric current applied to the upper deflector 202 and the lower deflector 203.

In other words, as illustrated in FIG. 17, a visual field 1702 is scanned, not a visual field 1701 in which the amount of deflection in the center of a typical visual field takes zero. In FIG. 17, the case is taken as an example where an offset is provided on an electric current in such a manner that the center of the visual field is greatly moved in the Y-direction. However, the moving direction of the center of the visual field is a given direction. The pixel size is controlled in such a manner that the pixel size is small on the order of nanometers in both of the X-direction and the Y-direction. Thus, it is possible to acquire an SEM image in a small pixel size with a large deflection. Moreover, it may be fine that an image in a visual field in which the sizes are different in the X-direction and the Y-direction is acquired as a visual field 1703 and a part of the image is used to obtain an image equivalent to the image obtained by scanning the visual field 1702. It is noted that the pattern to acquire an SEM image is not necessarily a line pattern, which is a given pattern. However, in order to highly accurately measure an image blur caused by a deflection aberration, the pattern is desirably a pattern in a micro structure on the order of a few nanometers.

In Step S1603, the deflection aberration evaluation unit 222 is used to read an image stored on the image storage unit 223 to measure the resolution, and the resolution is considered to be the evaluation value of a deflection aberration. For the measurement of the resolution of an SEM image, a given method is used as long as the method is a method that quantifies the image blur of the overall SEM image such as a CG method or a DR method. Alternatively, since the length measurement value of the line pattern is in the correlation with the resolution in the case where the pattern is a line pattern, it may be fine that the length measurement value is a resolution measurement value. This image is acquired as the image is greatly deflected in the entire area of the visual field, and an image blur caused by a deflection aberration is taken place. Therefore, the resolution of the image is measured, so that the degree of an image blur caused by a deflection aberration can be quantified. Moreover, the pixel size is small as on the order of nanometers, an image blur caused by a deflection aberration can be highly accurately measured. Furthermore, this method is advantageous that the method can be implemented on a given sample.

Steps S1604 to S1607 are similar to Steps S304 to S307.

With the use of the method described above, it is possible to suppress image blurs caused by a deflection aberration at the upper and lower ends of the visual field when the size of the visual field in the Y-direction is greatly expanded, and it is possible to perform length measurement of high resolution in the X-direction. Thus, it is possible to implement a decrease in damage to the sample in the acquisition of an SEM image and the efficient measurement of a phenomenon in a long cycle such as wiggling.

It is noted that this flowchart is a flowchart in which the optimum intensity ratio and the optimum rotation angle are determined and the conditions are set to the device to acquire an SEM image for length measurement. However, it may be fine that a part of the processes is performed. For example, it may be fine that the processes up to S1605 are performed, that is, the processes up to the process that the conditions of the optimum intensity ratio and the optimum rotation angle are stored on the upper and lower stage settings storage unit 213 are performed. Thus, when the subsequent image is acquired, the stored settings are read to acquire an SEM image of a small image blur caused by a deflection aberration.

Example 5

As another exemplary embodiment of the first method and the second method for solving the problems, an SEM will be described in which the state of the device is monitored by highly accurately measuring an image blur caused by a deflection aberration, misalignment in association with deflection, image distortion caused by a deflection aberration, and the like.

Figure 18:
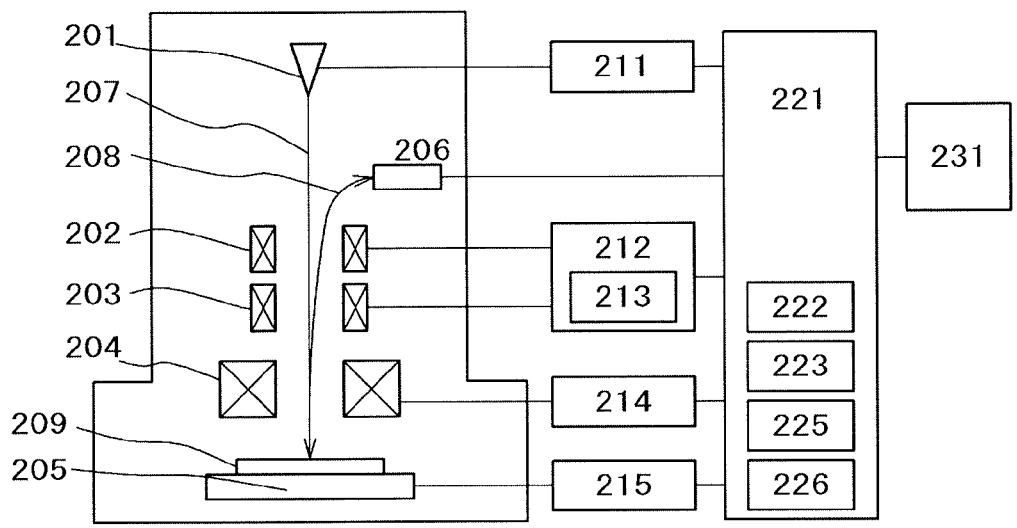
FIG. 18 is a schematic diagram of an overall configuration of an SEM according to a fifth embodiment.

FIG. 18 is a schematic diagram of an overall configuration of an SEM according to the embodiment. The control arithmetic and logic unit 221 that controls the overall device includes an evaluation value storage unit 225 that temporarily stores the evaluation value of a deflection aberration determined by the deflection aberration evaluation unit 222 and a deflection aberration determining unit 226 that determines whether the deflection aberration is within a tolerance. The other components illustrated in FIG. 18 are similar to the components in FIG. 2 other than the portions described later.

It is noted that an electrostatic lens or an electromagnetic lens other than the objective lens, an astigmatism corrector that corrects the astigmatism of the primary electron beam 207, deflectors that deflect the primary electron beam 207 other than the upper deflector 202 and the lower deflector 203, and the other components acting on the electron beam may be included.

Figure 19:
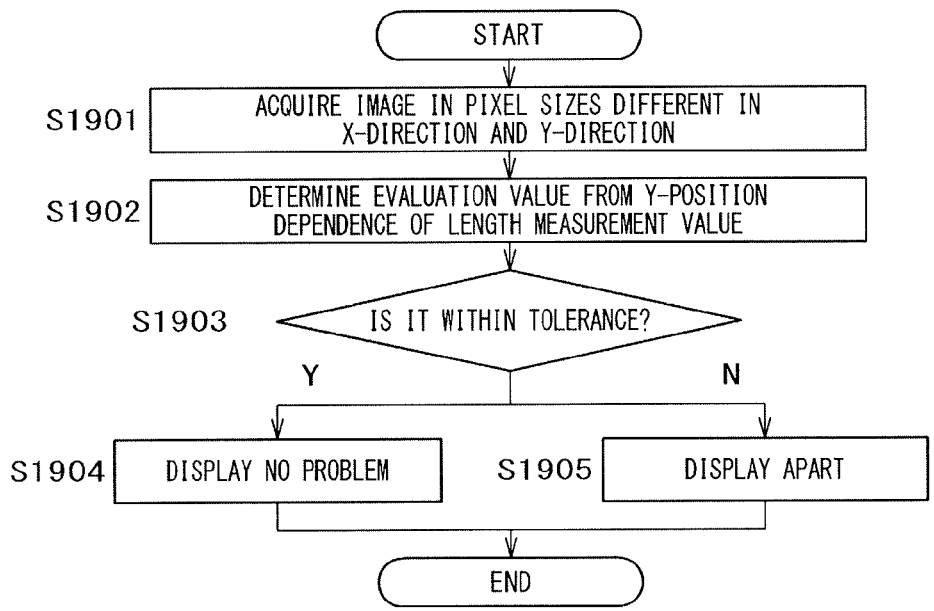
FIG. 19 is a flowchart of the fifth embodiment.

FIG. 19 is a flowchart of the embodiment. In the following, the description will be made along the flowchart.

Step S1901 is similar to Step S302.

In Step S1902, the deflection aberration evaluation unit 222 is used to read an image stored on the image storage unit 223, and the determined evaluation value is stored on the evaluation value storage unit 225, not on the search condition storage unit 224. The process is similar to Step S303 except the storing.

In Step S1903, the deflection aberration determining unit 226 is used to read the evaluation value stored on the evaluation value storage unit 225 in Step S1902, and it is determined whether the evaluation value is within a predetermined tolerance. In the case where the evaluation value is within a predetermined tolerance, the process goes to Step S1904, whereas in the case where the evaluation value is not within a predetermined tolerance, the process goes to Step S1905.

In Step S1904, a display as in FIG. 20A expressing that the influence of a deflection aberration is within an allowable range and the intensity ratio and rotation angle of the two-stage deflector are sufficiently adjusted is displayed on the display device 231. It is noted that it may be fine that in the case where this display is unnecessary, the step is omitted, and the flowchart is finished as it is.

In Step S1905, a display as in FIG. 20B expressing that the influence of a deflection aberration exceeds an allowable range is displayed on the display device 231 to call the operator's attention. Alternatively, it may be fine that a display as in FIG. 20C to prompt the operator to adjust the intensity ratio and rotation angle of the two-stage deflector is displayed, and the intensity ratio and the rotation angle are adjusted by the method according to any one of the first to fourth embodiments by an input from the operator. Moreover, it may be fine that the intensity ratio and the rotation angle are automatically adjusted by the method according to any one of the first to fourth embodiments without displaying such a display.

It is noted that here, the case is described where the evaluation value of a deflection aberration is determined by the method described in the first embodiment. However, it may be fine that Steps S1003 and S1004 are performed instead of Step S1902 and the evaluation value of a deflection aberration is determined by the method described in the second embodiment, or it may be fine that Step S1303 is performed instead of Step S1902 and the evaluation value of a deflection aberration is determined by the method described in the third embodiment. It may be fine that Steps S1602 and S1603 are performed instead of Steps S1901 and S1902 and the evaluation value of a deflection aberration is determined by the method described in the fourth embodiment. It is noted that in any cases, the evaluation value determined using the deflection aberration evaluation unit 222 is stored on the evaluation value storage unit 225, not on the search condition storage unit 224.

With the use of the method described above, is possible to detect the state in which image blurs caused by a deflection aberration at the upper and lower ends of the visual field are large when the size of the visual field in the Y-direction is greatly expanded. This method is performed on a regular basis, so that it is possible to maintain the state of the device in the optimum all the time.

Example 6

As an exemplary embodiment of a third method for solving the problems, an SEM will be described in which a focal point, an astigmatic point, or a deflection chromatic aberration is adjusted according to the amount of deflection in the Y-direction, so that an aberration in association with deflection (an image field curvature aberration, an astigmatism, or a deflection chromatic aberration) is decreased, and image blurs at the upper and lower ends of the visual field are decreased.

Figure 21:
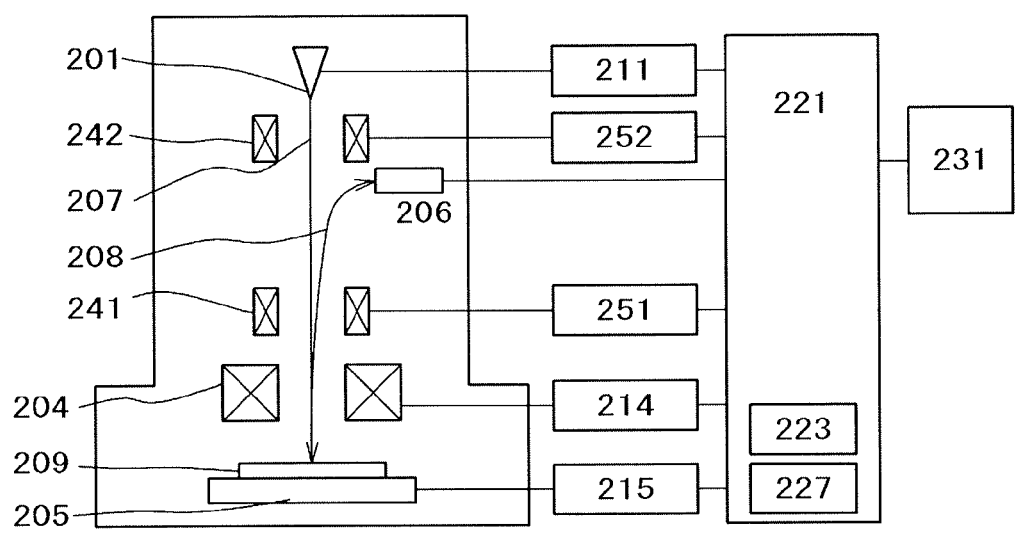
FIG. 21 is a schematic diagram of an overall configuration of an SEM according to a sixth embodiment.

FIG. 21 is a schematic diagram of an overall configuration of an SEM according to the embodiment, including a deflector 241 that deflects the primary electron beam 207 and an aberration corrector 242 that corrects the deflection aberration of the primary electron beam 207 (it is an astigmatism corrector in the embodiment). The deflector 241 is controlled by a deflector control unit 251, and the astigmatism corrector 242 is controlled by an astigmatism corrector control unit 252. It is noted that it may be fine that the deflector 241 has a one-stage configuration, or has a two-stage configuration as the upper deflector 202 and the lower deflector 203 in FIG. 2. Moreover, it may be fine that a deflector other than this deflector is included. The control arithmetic and logic unit 221 that controls the overall device includes a dynamic correction amount computing unit 227 that calculates a dynamic correction amount according to the amount of deflection in the Y-direction. The other components illustrated in FIG. 21 are similar to the components in FIG. 2 other than the portions described later. It is noted that an electrostatic lens or an electromagnetic lens other than the objective lens, deflectors that deflect the primary electron beam 207 other than the deflector 252, and the other components acting on the electron beam may be included.

In the following, the operation of the dynamic correction amount computing unit 227 will be described.

Figure 22:
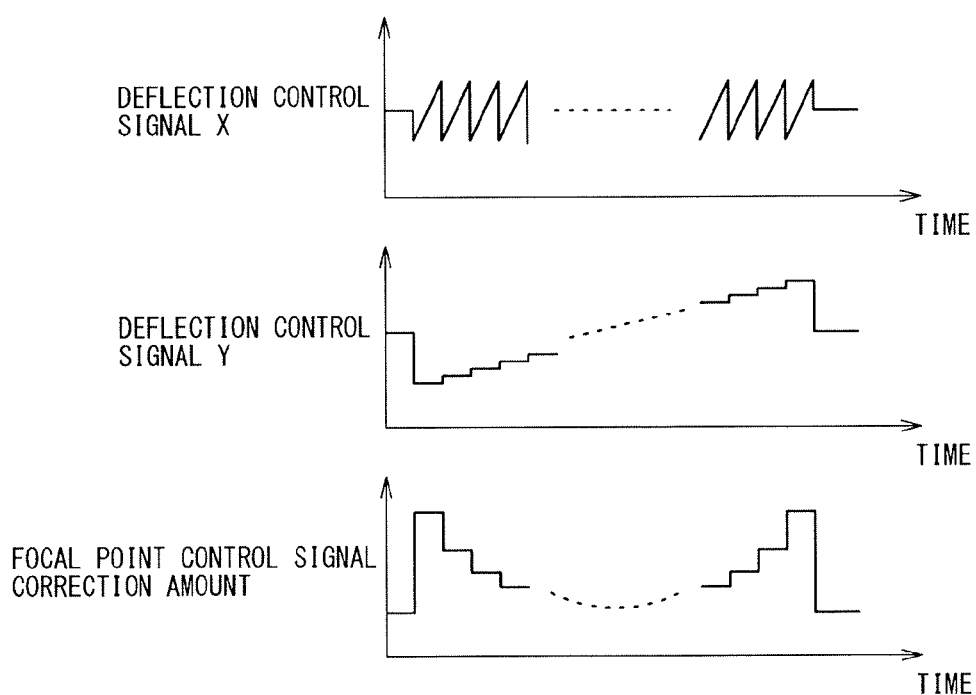
FIG. 22 is the relationship between deflection control signals and a focus control signal correction amount.

The dynamic correction amount computing unit 227 corrects a focus control signal sent from the control arithmetic and logic unit 221 to the objective lens control unit 214 based on a deflection control signal sent from the control arithmetic and logic unit 221 to the deflector control unit 251. In other words, here, the objective lens is also used as an aberration corrector. FIG. 22 is an example of deflection control signals and a focus control signal correction amount. This is an example in the case where the direction of the scanning line is the X-direction in which the deflection control signal in the X-direction is changed at high speed on one hand, and a change in the deflection control signal in the Y-direction is at a low frequency as compared with a change in the deflection control signal in the X-direction on the other hand. One step observed in the deflection control signal in the Y-direction corresponds to one scanning line. As illustrated in FIG. 22, the focus control signal correction amount is changed for every scanning line. By the method described above, an image field curvature aberration can be decreased.

In the previously existing method, it is necessary to also make a change according to the deflection control signal in the X-direction, and high-speed control is necessary. However, this method can be implemented by control at slow speed. In this method, although an image field curvature aberration caused by deflection in the X-direction is not enabled to decrease, an image field curvature aberration caused by deflection in the X-direction can be almost ignored in the case where an SEM image is acquired with a great deflection only in the Y-direction, and an image field curvature aberration can be sufficiently decreased. It may be fine that the focus control signal correction amount is determined with reference to a predetermined table as in FIG. 23, or it may be fine that the focus control signal correction amount is calculated from a relational expression of a predetermined focus control signal correction amount to the deflection control signal in the Y-direction. Moreover, here, the description is made in the case where the focus control signal correction amount is changed for every scanning line, that is, in the case where line scanning is performed in the X-direction in which the pixel size is small, and an aberration is corrected for every deflection operation in which the start position of the scanning line is moved in the Y-direction in which the pixel size is great. However, it may be fine that other linking methods are used. For example, it may be fine that an image field curvature aberration can be decreased by control at slow speed in which the number of times of performing the aberration correction operation is smaller than the number of times of performing the deflection operation in which the start position of the scanning line is moved in such a manner that the focus control signal correction amount is changed for each of a plurality of the scanning lines.

With the use of the method described above, it is possible to decrease an image field curvature aberration with no need of high-speed focus control, and it is possible to suppress image blurs caused by a deflection aberration at the upper and lower ends of the visual field when the size of the visual field in the Y-direction is greatly expanded, and it is possible to perform length measurement of high resolution in the X-direction.

It is noted that here, the description is made as the case is taken as an example where the focus control signal to be sent to the objective lens control unit 214 is corrected to decrease an image field curvature aberration. However, instead of the correction, it may be fine that a voltage control signal to be sent to the retarding control unit 215 is corrected in the case where a retarding electrode is used for an aberration corrector, or it may be fine that a control signal controlling another unit that controls focus is corrected in the case where that unit is provided.

Moreover, it may be fine that in the case where an astigmatic point control signal to be sent from the control arithmetic and logic unit 221 to the astigmatism corrector control unit 252 is provided or another unit that controls the astigmatic point is provided, a control signal controlling the unit is corrected to decrease astigmatism, not to decrease an image field curvature aberration.

Furthermore, it may be fine that both of an image field curvature aberration and an astigmatism are decreased. Thus, it is possible to decrease both of an image field curvature aberration and an astigmatism with no need of high-speed control over the focal point and the astigmatic point, and it is possible to suppress image blurs caused by a deflection aberration at the upper and lower ends of the visual field when the size of the visual field in the Y-direction is greatly expanded, and it is possible to perform length measurement of high resolution in the X-direction. In the case of using this method, it is possible to decrease a slightly remaining deflection aberration even under the optimum conditions obtained in the other embodiments, and the method is advantageous to realize the state of a smaller deflection aberration.

Example 7

Figures 23, 24:
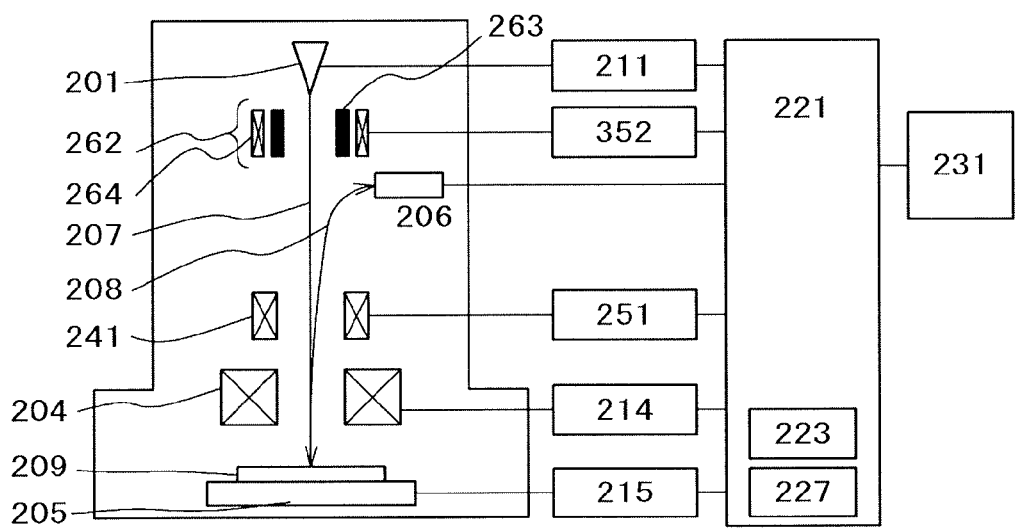
FIG. 23 is a table of the relationship between the deflection control signal and the focus control signal correction amount.
FIG. 24 is a schematic diagram of an overall configuration of an SEM according to a seventh embodiment.

As another exemplary embodiment of the third method for addressing the problems, an example of deflection chromatic aberration correction will be described. FIG. 24 is a schematic diagram of an overall configuration of an SEM according to the embodiment. The difference from FIG. 21 is in that an aberration corrector 262 is configured to correct all of aberrations including a deflection chromatic aberration, an astigmatism, and an image field curvature. More specifically, the aberration corrector 262 includes an eight-pole electrostatic deflector 263 that can superpose an offset voltage and an astigmatism correction voltage and an electromagnetic deflector 264 disposed so as to surround the eight-pole electrostatic deflector 263. Thus, the offset voltage is controlled to perform focus correction in which electrostatic deflection and electromagnetic deflection are performed in the reverse directions, so that a deflection chromatic aberration can be corrected. The deflection chromatic aberration is also an aberration taken place in association with deflection, causing the degradation of resolution in association with deflection similarly to an image field curvature and an astigmatism.

Also in the embodiment, an aberration corrector control unit 352 is controlled according to the deflection control signal in the Y-direction. Here, the spacing between scanning lines for correction were at irregular spacings. More specifically, in order to correct an image field curvature suddenly increased in association with an elongated deflection with a well scheme, the frequency of correction was more increased as the position was closer to both ends of the Y-direction with a large amount of deflection.

FIG. 25 is a screen of a display device according to the embodiment. Also in the embodiment, types of aberrations to be corrected are selectable. The upper part of the screen is the area for selecting types of aberrations to be corrected in which selection is made by ON or OFF. In this drawing, focus correction and deflection chromatic aberration correction are selected for correcting an image field curvature. Moreover, the timing to correct an aberration is also selectable. As illustrated in the lower part of the screen, in the case where correction is made for the same number with respect to the number of scanning lines (in other words, the number of times of changing the start position of the scanning line for deflection), regular spacings are selected, whereas in the case where correction is made for the different number, irregular spacings are selected.

Furthermore, the number of scanning lines for correction can be specified. In the case of irregular spacings, spacings are narrowed as the scanning lines come closer to both ends in the Y-direction based on the number of the scanning lines on the display. In the drawing, it is shown that five scanning lines are specified on the basis of irregular spacings. As described above, in the embodiment, it is possible to change the timing for correction.

As described above, it is possible to suppress image blurs caused by a deflection aberration at the upper and lower ends of the visual field when the size of the visual field in the Y-direction is greatly expanded, and it is possible to perform length measurement of high resolution in the X-direction.

REFERENCE SIGNS LIST

101 . . . line pattern,
102 . . . scanning line,
103 . . . scanning line spacing,
104 . . . visual field,
201 . . . electron gun,
202 . . . upper deflector,
203 . . . lower deflector,
204 . . . objective lens,
205 . . . stage,
206 . . . detector,
207 . . . primary electron beam,
208 . . . secondary electrons,
209 . . . sample,
211 . . . electron gun control unit,
212 . . . two-stage deflector control unit,
213 . . . upper and lower stage settings storage unit,
214 . . . objective lens control unit,
215 . . . retarding control unit,
221 . . . control arithmetic and logic unit,
222 . . . deflection aberration evaluation unit,
223 . . . image storage unit,
224 . . . search condition storage unit,
225 . . . evaluation value storage unit,
226 . . . deflection aberration determining unit,
227 . . . dynamic correction amount computing unit,
231 . . . display device,
251 . . . deflector control unit,
252 . . . aberration correction control unit,
252 . . . aberration correction control unit,
262 . . . aberration corrector,
263 . . . electromagnetic deflector,
264 . . . eight-pole electrostatic deflector,
501 . . . Y-position dependence of a length measurement value,
502 . . . Y-position dependence of a length measurement value,
503 . . . Y-position used in determination of an evaluation value,
504 . . . length measurement value,
505 . . . length measurement value,
1101 . . . Y-position dependence of the amount of misalignment,
1102 . . . Y-position dependence of the amount of misalignment, 1103 . . . Y-position used in determination of an evaluation value,
1104 . . . amount of misalignment,
1105 . . . amount of misalignment,
1401 . . . Y-position dependence of a pattern position,
1402 . . . Y-position dependence of a pattern position,
1403 . . . Y-position used in determination of an evaluation value,
1404 . . . pattern position,
1405 . . . pattern position,
1701 . . . visual field without a deflection offset,
1702 . . . visual field with a deflection offset,
2601 . . . dependence of the amount of a deflection aberration on the amount of deflection,
2602 . . . dependence of the amount of a deflection aberration on the amount of deflection,
2701 . . . pattern position at a certain Y-position evaluated from one SEM image,
2702 . . . linear straight line of focal point dependence of a pattern position.

The invention claimed is:

1. A charged-particle beam device comprising:
a sample stage on which a sample is placed;
a scanning optical system that scans a charged particle beam over the sample;
a first deflector and a second deflector that deflect the charged particle beam;
an image acquiring unit that acquires an image having a pixel size greater in a second direction than in a first direction based on electrons emitted from the sample;
an image storage unit that stores a plurality of the images in which combination conditions of a deflection intensity ratio and a rotation angle for the first deflector and the second deflector are changed; and
an evaluation unit that determines a combination of the deflection intensity ratio and the rotation angle for the first deflector and the second deflector based on a variation in the second direction in the stored plurality of the images.

2. The charged-particle beam device according to claim 1, wherein: an image acquired at the image acquiring unit is a line pattern; and
the second direction is a direction in which the line pattern is extended.

3. The charged-particle beam device according to claim 1, wherein: an image acquired at the image acquiring unit is a line pattern; and
a variation in the second direction is a dimension measurement value of the line pattern.

4. The charged-particle beam device according to claim 1, wherein: an image acquired at the image acquiring unit is a line pattern; and
the evaluation unit makes the evaluation based on a difference between a dimension measurement value of the line pattern in a center part of the image and a dimension measurement value of the line pattern at an end portion of the image.

5. The charged-particle beam device according to claim 1, wherein: an image acquired at the image acquiring unit is a line pattern; and
the evaluation unit makes the evaluation based on a difference between a positional displacement amount of the line pattern in center parts of two of the images and a positional displacement amount of the line pattern at end portions of the two images.

6. The charged-particle beam device according to claim 1, wherein: an image acquired at the image acquiring unit is a line pattern; and
the evaluation unit makes the evaluation based on a difference between a position of the line pattern in a center part of the image and a position of the line pattern at an end portion of the image.

7. The charged-particle beam device according to claim 1, wherein when a value of the evaluation is not within a predetermined tolerance, a control computing unit that displays that a value of the evaluation is not within the tolerance.

8. A charged-particle beam device comprising:
a sample stage on which a sample is placed;
a scanning optical system that scans a charged particle beam over the sample;
an aberration correction unit that corrects an aberration in the scanning optical system;
a deflector that deflects the charged particle beam;
an image acquiring unit that acquires an image having a pixel size greater in a second direction than in a first direction based on electrons emitted from the sample; and
a control computing unit that calculates an amount to correct an aberration by the aberration correction unit based on the acquired amount of deflection in the second direction.

9. The charged-particle beam device according to claim 8, wherein the aberration correction unit is any one of a focal position changing unit, an astigmatism correction unit, and a deflection chromatic aberration unit, or a combination of the units.

10. The charged-particle beam device according to claim 8, wherein after making scanning in the first direction, the aberration correction unit corrects an aberration in linking to an deflection operation in which a start position of scanning line is moved.

11. The charged-particle beam device according to claim 10, wherein a number of times of performing operations of the aberration correction is smaller than a number of times of performing the deflection operation.

* * * * *